US 12,456,675 B2

(12) United States Patent
Weckx

(10) Patent No.: US 12,456,675 B2
(45) Date of Patent: Oct. 28, 2025

(54) METHOD FOR PRODUCING AN INTERCONNECT VIA

(71) Applicant: Imec vzw, Leuven (BE)

(72) Inventor: Pieter Weckx, Bunsbeek (BE)

(73) Assignee: Imec vzw, Leuven (BE)

( * ) Notice: Subject to any disclaimer, the term of this patent is extended or adjusted under 35 U.S.C. 154(b) by 845 days.

(21) Appl. No.: 17/494,087

(22) Filed: Oct. 5, 2021

(65) Prior Publication Data

US 2022/0108948 A1   Apr. 7, 2022

(30) Foreign Application Priority Data

Oct. 6, 2020 (EP) .................................... 20200264

(51) Int. Cl.
*H01L 23/522* (2006.01)
*H01L 21/311* (2006.01)
*H01L 21/768* (2006.01)

(52) U.S. Cl.
CPC .... *H01L 23/5226* (2013.01); *H01L 21/31144* (2013.01); *H01L 21/76831* (2013.01);
(Continued)

(58) Field of Classification Search
CPC .......... H01L 23/5226; H01L 21/31144; H01L 21/76831; H01L 21/76832; H01L 21/7684; H01L 21/76879; H01L 21/76897; H01L 21/76883; H01L 21/76811; H01L 21/76813; H01L 21/76834;
(Continued)

(56) References Cited

U.S. PATENT DOCUMENTS 6,455,436 B1   9/2002  Ueda et al.
2005/0136588 A1*  6/2005  Speyer .............. H01L 21/76283
                                                      438/520
(Continued)

FOREIGN PATENT DOCUMENTS

WO    2015047321 A1    4/2015
WO    2016105350 A1    6/2016
WO    2017105445 A1    6/2017

OTHER PUBLICATIONS

Extended European Search Report and Written Opinion, Application No. EP20200264.8, mailed Apr. 6, 2021, 9 pages.

*Primary Examiner* — Christine S. Kim
*Assistant Examiner* — Sesha Sairaman Srinivasan
(74) *Attorney, Agent, or Firm* — McDonnell Boehnen Hulbert & Berghoff LLP

(57) ABSTRACT

A method includes: producing on a substrate a stack of: a first layer including a first dielectric material, a second layer including dielectric material on the first layer, and an etch stop layer between the first layer and the second layer, etching a trench through the second layer, the etch stop layer, and the first layer, producing a lower conductive line in the trench, producing a third layer including a second dielectric material in the trench and on the tower conductive line, removing a first portion of the second layer, such that a second portion of the second layer remains in contact with the etch stop layer, etching a via opening through the third layer in the trench, using the second portion of the second layer as a mask, and depositing a conductive upper line and an interconnect via on the lower conductive line within the via opening.

20 Claims, 19 Drawing Sheets

(52) U.S. Cl.
CPC .... *H01L 21/76832* (2013.01); *H01L 21/7684* (2013.01); *H01L 21/76879* (2013.01); *H01L 21/76897* (2013.01)

(58) Field of Classification Search
CPC ......... H01L 21/76885; H01L 21/76898; H01L 21/76829; H01L 23/5384; H01L 23/5386
See application file for complete search history.

(56) References Cited

U.S. PATENT DOCUMENTS

| | | | |
|---|---|---|---|
| 2016/0197011 A1 | 7/2016 | Bristol et al. | |
| 2016/0307793 A1* | 10/2016 | Huang | H01L 23/53209 |
| 2018/0211911 A1* | 7/2018 | Wu | H01L 21/76897 |
| 2019/0355620 A1 | 11/2019 | Freed et al. | |
| 2020/0066586 A1* | 2/2020 | Lin | H01L 21/76871 |
| 2020/0098688 A1* | 3/2020 | Shi | H01L 21/28568 |

* cited by examiner

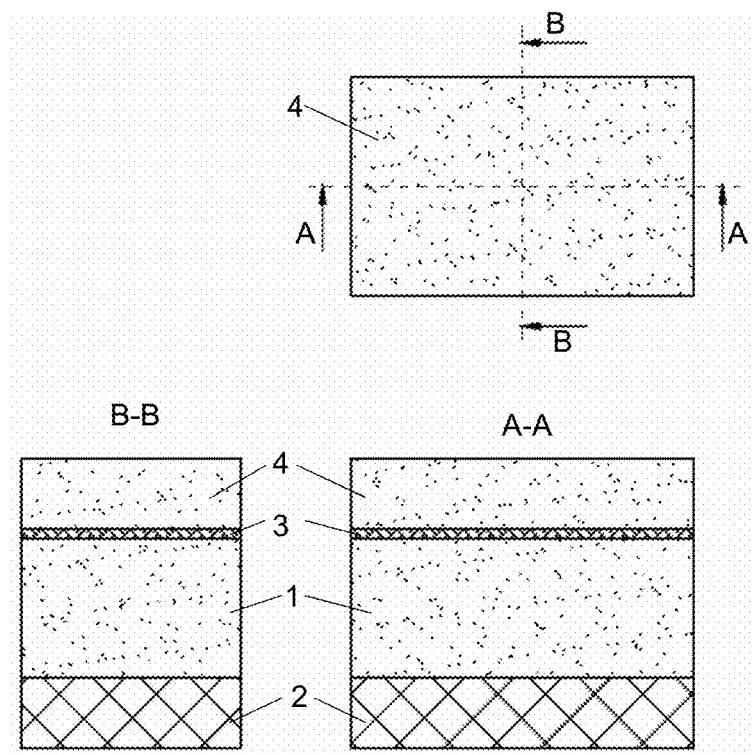
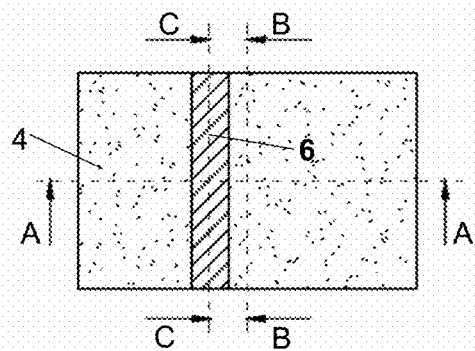
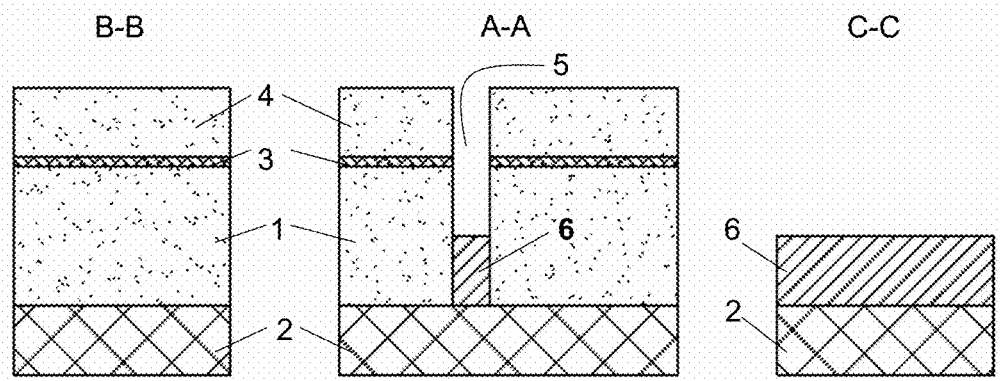
FIG. 1A
FIG. 1B

METHOD FOR PRODUCING AN INTERCONNECT VIA

CROSS-REFERENCE TO RELATED APPLICATIONS

The present application is a non-provisional patent application claiming priority to European Patent Application No, 20200264,8, tiled Oct. 6, 2020, the contents of which are hereby incorporated by reference.

FIELD OF THE DISCLOSURE

The present disclosure is related to semiconductor processing, in particular to the fabrication of electrically conductive multi-layer structures, applicable in back end of line processing.

BACKGROUND

Semiconductor-based integrated circuits continue to evolve towards shrinking dimensions, leading to ongoing processing challenges, Multilayer conductive structures are typically built as layers of arrays of parallel conductive lines, wherein the arrays of two consecutive levels are arranged crosswise relative to each other with vias formed between lines of the respective arrays. As dimensions shrink, traditional lithography and etch processes are no longer able to ensure acceptable alignment between a via and the underlying and overlying lines to which the via is connected.

One example of a particular context in which this problem is encountered is in the interconnect routing to standard logic cells of 2-dimensional layout. As the chip surface area occupied b the standard cells decreases, up-to-tip spacing between collinear conductive lines in the M1 level of the back end of line decreases accordingly, posing challenges when it comes to connecting the line ends of the collinear conductors to conductors in the underlying and overlying layers. This may also be the case for lines in the M3 level. Self-aligned processing: techniques have therefore been developed, enabling constructs which are unattainable by traditional lithography. For example, patent publication document US 2016/0197011 discloses a method wherein "photobuckets" are used, i.e. deposition of material which acts as a photo-sensitive switch, in order to create a via that is self-aligned to two neighboring crosswise oriented conductors. This method requires a rather large number of process steps. Patent publication document WO 2015/047321 discloses a method for obtaining the same construct, using block copolymers. This process is however not scalable to pitch dimensions in the order of a few tens of nanometres.

In order to increase the flexibility of semiconductor processing and its adaptability to further shrinking dimensions, further alternatives to these existing methods are therefore required.

SUMMARY

The method of the disclosure is a method for producing an interconnect via that connects a lower conductive line tea a transversely oriented upper conductive line, the upper line having one line end that is aligned with the lower line, wherein the method is configured so that the via is self-aligned to the width of the lower line and to at least the line end of the upper line. According to the disclosure, this construct is produced by using different interlayer dielectric materials (ILD) which can be etched selectively, one with respect to the other, As known to the skilled person, interlayer dielectric materials are materials suitable for insulating electrically conductive lines m are interconnect structure of a semiconductor component, such as the back and of line (BEOL) stack of an integrated circuit chip. A layer of a first ILD material is deposited followed by an etch stop layer and an additional layer of an ILD material, for example the same material as the first ILD material. The lower conductive line is formed by etching a trench and filling it with a conductive material, for example a metal, for example Cu, Co, or Ru. Then the trench (above the lower line) is filled with a second ILD material, for example to the level of the upper surface of the etch stop layer or slightly above the upper surface. Then the ILD material of the top layer is removed at one side of at least part of the trench by etching down to the etch stop layer, while maintaining a portion of the ILD material of the top layer on the opposite side of the trench, the remaining portion being self-aligned to the opposite side. The remaining portion of ILD material, along with other masking material, is then used for etching a via opening in the second ILD material, the via opening being self-aligned to the width of the lower conductive line. By filling the via opening and producing a patterned metal layer around the remaining portion of ILD material, the upper line is formed.

According to a first embodiment, the other masking material is a hardmask that defines the width of the via opening in the direction of the lower line. According to a second embodiment, the other masking material comprises portions of a third ILD material, the positions being placed on either side of the via opening by preliminary steps of depositing the third ILD material in the trench above the second ILD material, and patterning the third ILD material in accordance with the width of the upper line.

The first and second embodiment can be applied for fabricating two collinear lines in the upper level, spaced apart by a tip-to-tip spacing that is self-aligned to the distance between adjacent lines in the lower level, and connected to the lower lines by interconnect vias which are self-aligned to the width of the respective lower lines and to at least the line ends of the collinear upper lines.

The disclosure is in particular related to a method for producing an interconnect via for a semiconductor component, wherein the via is connected to two electrically conductive lines running in mutually transverse directions, the via being self-aligned at its lower end to the width of a lower electrically conductive line and at its upper end to at least the line end of an upper electrically conductive line, characterized in that the method comprises the steps of:

producing on a semiconductor base substrate a stack of:

A bottom layer of a first intermetal (e.g., interlayer) dielectric (ILD) material, an etch stop layer on the bottom layer, a top layer of ILD material on the etch stop layer, wherein the etch stopping function of the etch stop layer is relative to an etch recipe for etching the ILD material of the top layer, etching at least one trench through the complete thickness of the stack, producing the lower electrically conductive line at the bottom of the trench, i.e. filling a lower portion of the trench, producing a layer of a second ILD material in the trench and on top of the lower line, wherein the second ILD material is etchable selectively with respect to the ILD material of the top layer and vice versa, and wherein the second ILD material is also etchable selectively with respect to the etch stop layer.

by applying one or more etch masks and etching back the ILD material of the top layer and stopping on the etch stop layer, removing the ILD material of the top layer along at least a longitudinal portion of the trench located to one side of the trench, while maintaining the ILD material of the top layer at least along the same longitudinal portion located on the opposite side of the trench, so that a remaining portion of ILD material of the top layer protrudes above the etch stop layer, the remaining portion being self-aligned to the opposite side of the trench, etching a via opening through the second ILD material in the trench, using at least the remaining portion of the ILD material of the top layer as a mask, so that the via opening is self-aligned to the opposite side of the trench, along at least a part of the longitudinal portion of the trench, and producing the upper line and the interconnect via, by depositing an electrically conductive material, thereby tilling the via opening, and by producing a patterned layer of the conductive material on top of the interconnect via.

According to an embodiment, the lower conductive line is formed by filling the trench (5) with an electrically conductive material and etching back the conductive material down to the desired thickness of the lower line.

According to an embodiment, the layer of the second ILD material is produced by the trench with the second ILD material and etching back the second ILD material in the trench, selectively with respect to the top layer.

According to an embodiment, after the step of producing the layer of the second ILD material in the trench, a first mask is applied and the ILD material of the top layer is removed except at the location of the mask, thereby creating the remaining portion of ILD material in the form of a pillar that is self-aligned to the opposite side of the trench, followed, after stripping the first mask, by the application of a second mask configured to define the at least part of the longitudinal portion of the trench, and the upper line is produced by depositing an electrically conductive layer, thereby filling the via opening and enclosing the pillar, and thereafter patter ng the electrically conductive layer to thereby form the upper line.

According to an embodiment, after the step of producing the layer of the second ILD material in the trench, the trench is not completely filled, and a third ILD material is deposited in the trench on top of the layer of the second ILD material, wherein the third ILD material is etchable selectively with respect to the ILD material of the top layer, wherein the second ILD material is etchable selectively with respect to the third ILD material, and wherein the third ILD material is removed from the trench in an area corresponding to the width of the upper line, so that the remaining portions of the third ILD material on either side of the width serve as portions of a mask for etching the via opening, so that the opening is self-aligned to the width of the upper line.

The method according to the latter embodiment may comprise the steps of:

depositing a layer of the third ILD material thereby filling the trench, and planarizing the layer of the third ILD material until the upper surface of the top layer of ILD material is exposed, applying a first mask that defines the position and width of the upper line, removing the third ILD material from the trench, in an area defined by the first mask and by the ILD material of the top layer, with the first mask in place, applying a second mask which covers the ILD material of the top layer to the opposite side of the trench, while leaving the ILD material of the top layer on the one side of the trench exposed in an area corresponding to the upper line, with both masks in place, etching the ILD material of the top layer, stopping on the etch stop layer, and stripping the masks, thereby obtaining the remaining portion of ILD material that is self-aligned to the opposite side of the trench, while creating a transverse trench in the top layer on the other side of the trench, the transverse trench defining the position of the upper line.

etching the via opening, using at least the ILD material of the top layer, the etch stop layer and the third ILD material as a mask, and filling the via opening and the transverse trench with an electrically conductive material, thereby obtaining the interconnect via and the upper line.

According to an embodiment, two interconnect vias are produced, connecting a first and second mutually parallel lower line respectively to a first and second collinear upper line, the interconnect vias being self-aligned to the width of the respective lower lines and to at least the line ends of the respective upper lines.

According to an embodiment, the ILD material of the top layer is the same as the first ILD material.

The disclosure is equally related to a semiconductor component comprising a semiconductor base substrate and on this base substrate a front end of line portion and a back and of line portion, the back end of line portion comprising multiple levels (M0, M1, etc.) of interconnected electrical conductors, the levels being interconnected by interconnect vias, and wherein the BEOL portion comprises an interconnect via that is connected to two electrically conductive lines running in mutually transverse directions, the via being self-aligned at its lower end to the width of a lower electrically conductive line in a level $M_x$ of the BEOL portion and at its upper end to at least the line end of an upper electrically conductive line of a level $M_{x+1}$ of the BEOL portion, the electrically conductive lines and the interconnect via being embedded in at least two different ILD materials, characterized in that:

at least the line end of the upper line is in direct contact with a portion of ILD material, in the direction of the lower line, the interconnect via is isolated on both sides by a second ILD material, that is etchable selectively with respect to the ILD material of the portion in direct contact with the line end of the upper line and vice versa, an etch stop layer is present underneath the upper line, wherein the etch stopping function of the etch stop layer is relative to an etch recipe for etching the ILD material of the portion in direct contact with the line end of the upper line.

The disclosure is also related to a semiconductor substrate comprising at least one level of a multilevel interconnect structure, the at least one level comprising a line-shaped conductor oriented in a given direction and embedded in a layer of a first ILD material, the layer having a thickness higher than the conductor, wherein the conductor is located at the bottom of a trench through the layer of the first ILD material, the substrate further comprising:

an etch stop layer on the first layer of the first ILD material, and a portion of an ILD material extending above the etch stop layer and being aligned to one side of the trench, wherein the etch stopping function of the etch stop layer is relative to an etch recipe for etching the ILD material of the portion extending above the etch stop layer, and an elongate portion of a second ILD material that is selectively etchable with respect to the material of the portion extending above the etch stop layer and vice versa, the second material also being selectively etchable with respect to the etch stop layer, the elongate portion being present on top of the conductor, the elongate portion of the second ILD material being interrupted by a via adjacent to the ILD portion extending above the etch stop layer.

BRIEF DESCRIPTION OF THE FIGURES

The above, as well as additional, features will be better understood through the following illustrative and non-limiting detailed description of example embodiments, with reference to the appended drawings.

FIG. IK illustrates a first method embodiment, according to an example.

Figure 1C:
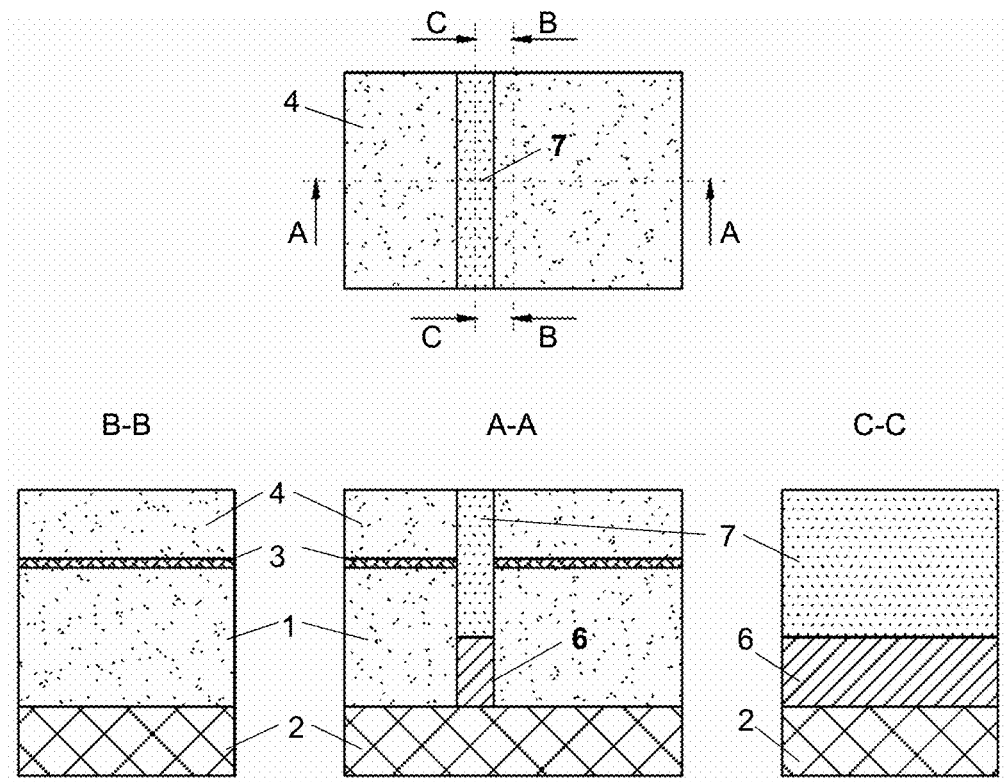
FIG. 1C illustrates a first method embodiment, according to an example.
Figure 1D:
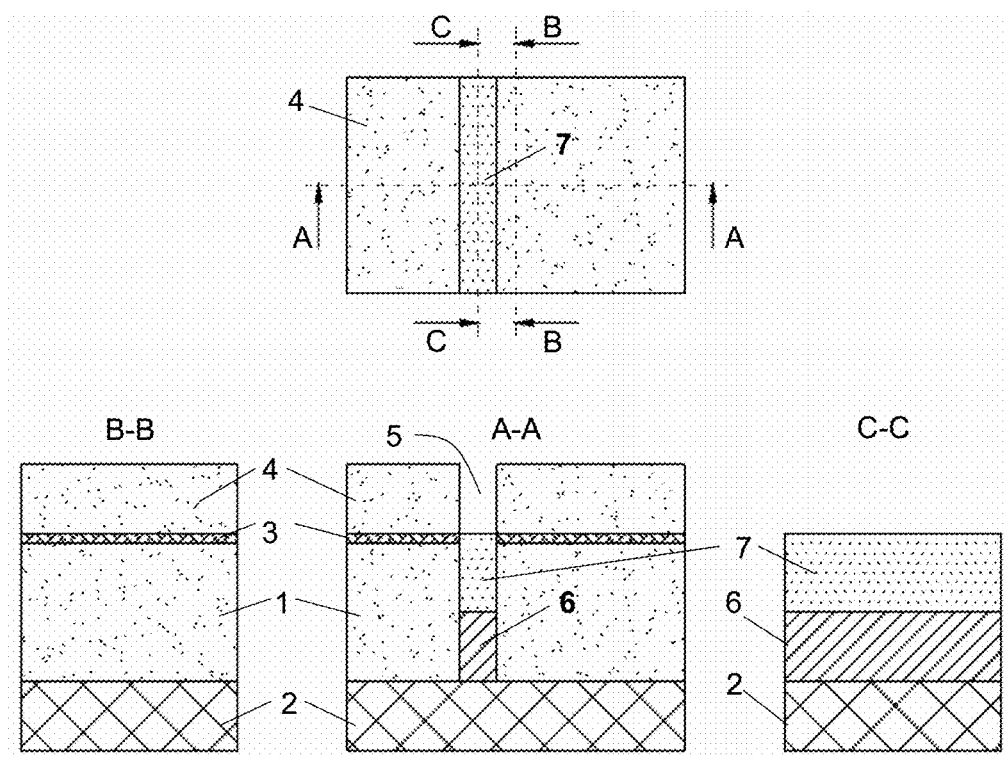
FIG. 1D illustrates a first method embodiment, according, to an example.
Figure 1E:
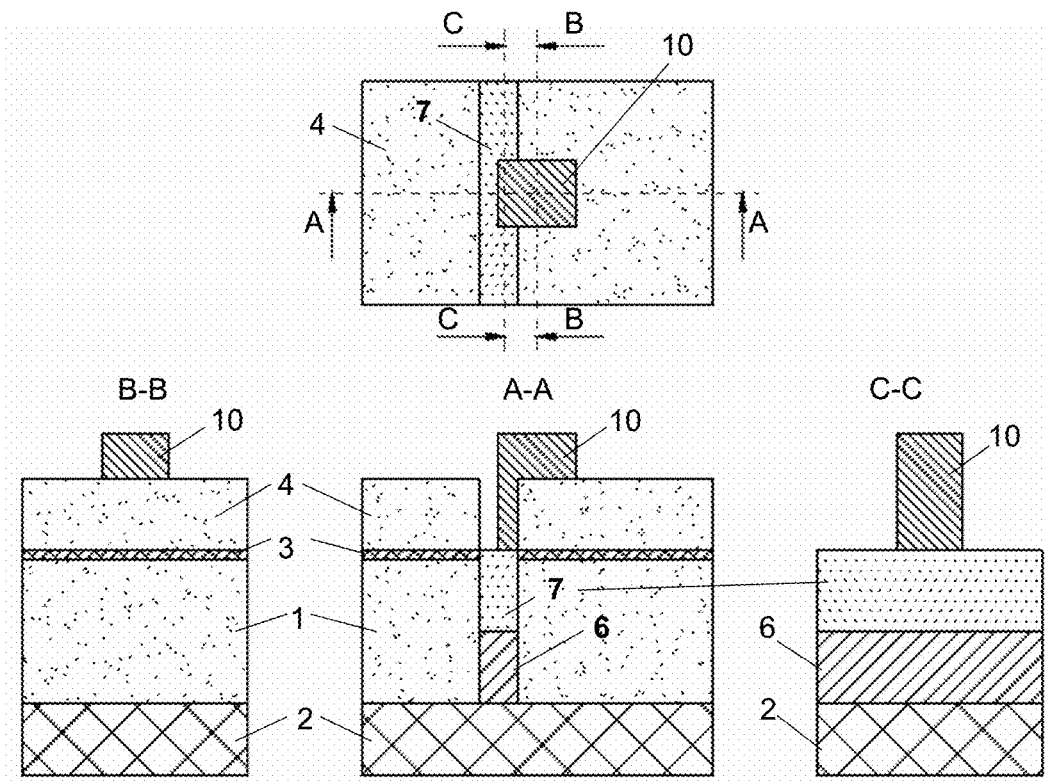
FIG. 1E illustrates a first method embodiment, according to an example.
Figure 1F:
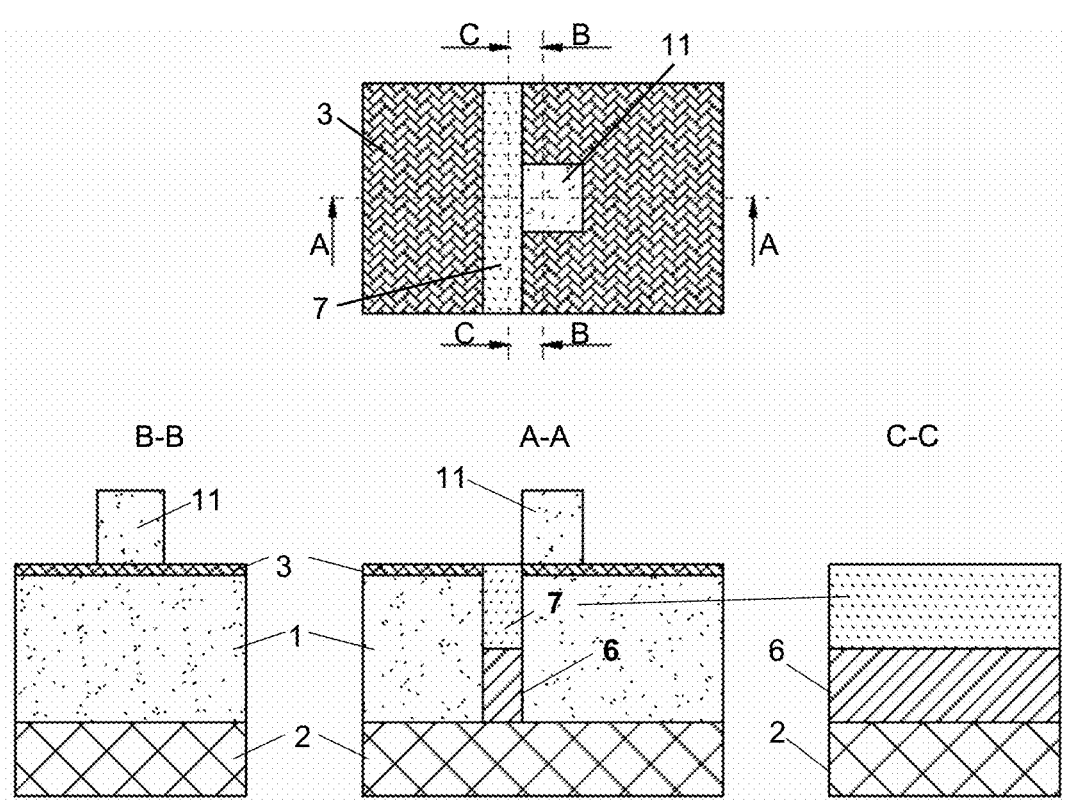
FIG. 1F illustrates a first method embodiment, according to an example.
Figure 1G:
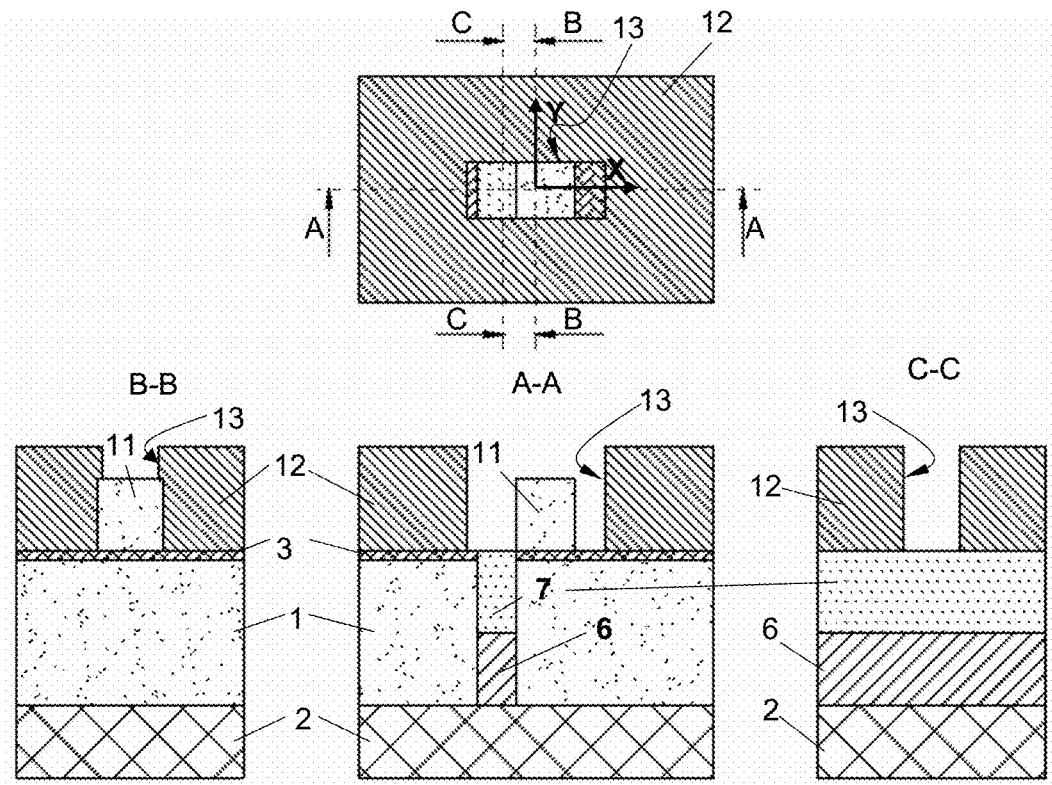
FIG. 1G illustrates a first method embodiment, according to an example.
Figure 1H:
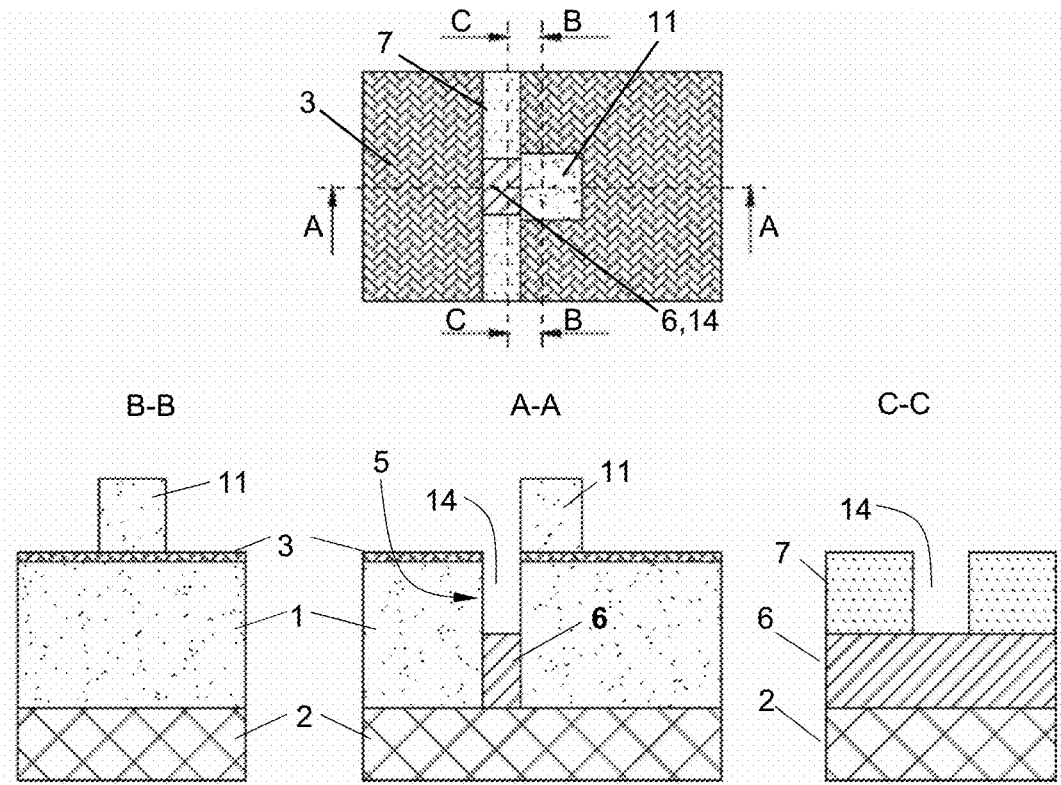
FIG. 1H illustrates a first method embodiment, according to an example.
Figure 1I:
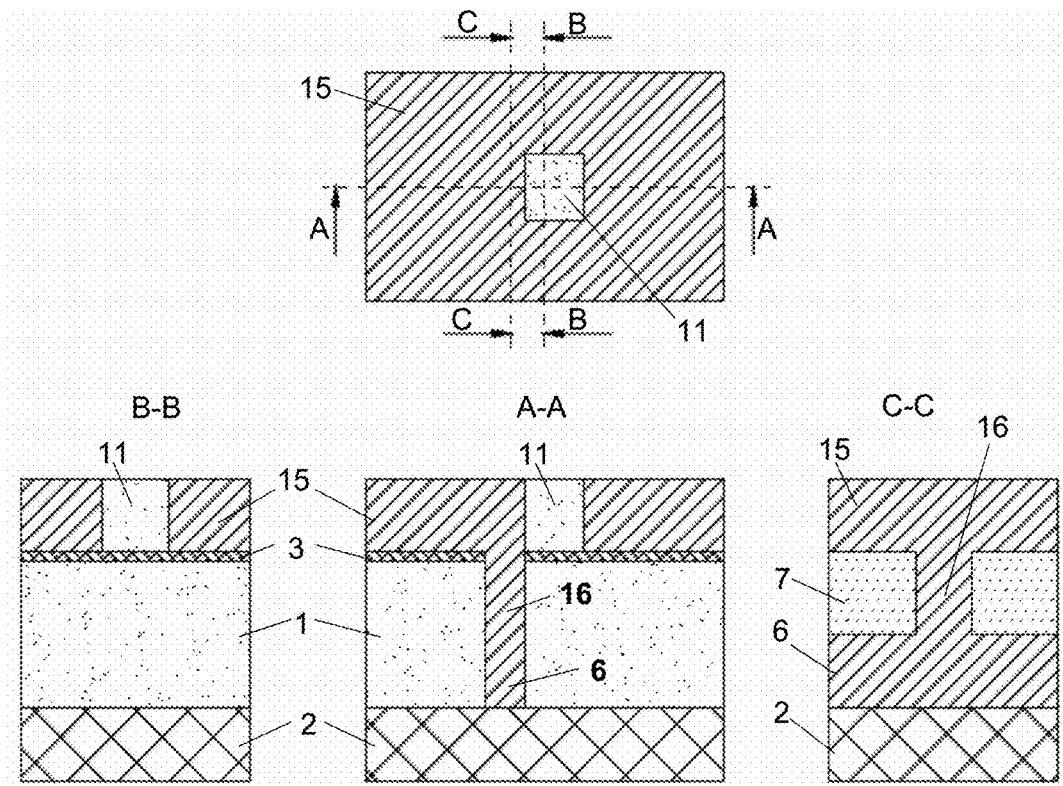
FIG. 1I illustrates a first method embodiment, according to an example.
Figure 1J:
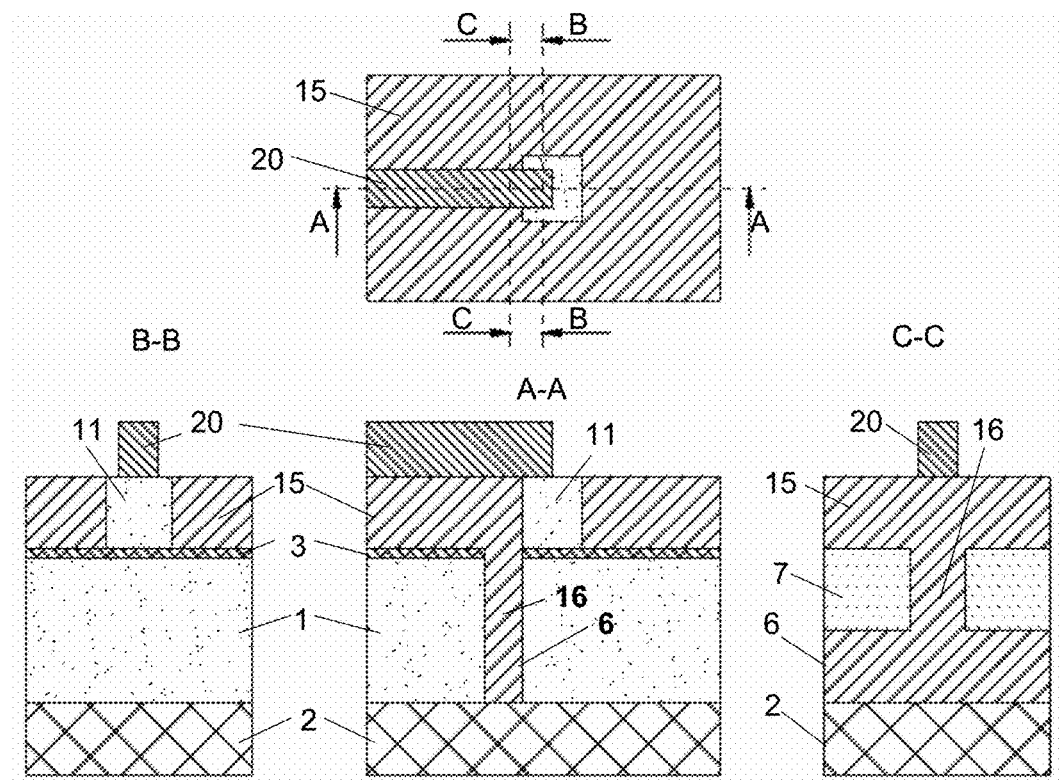
FIG. 1J illustrates a first method embodiment, according to an example.
Figure 1K:
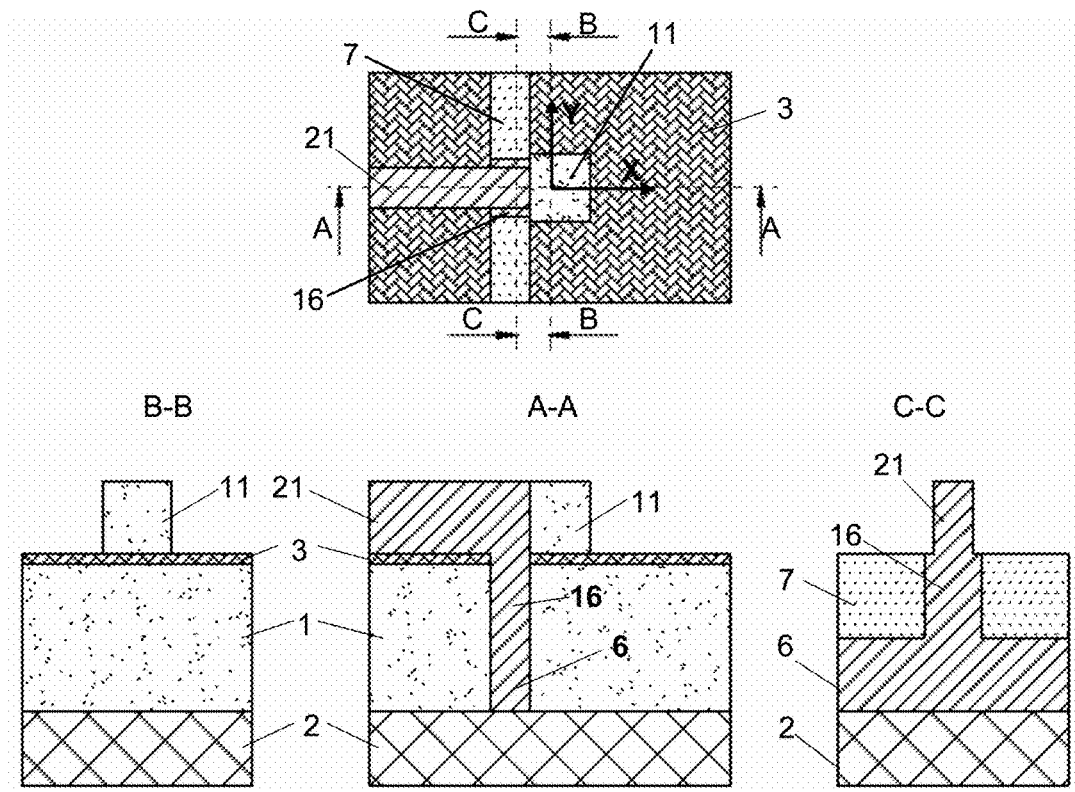
FIG. 1A illustrates a first method embodiment, according to an example.
FIG. 1B illustrates a first method embodiment, according to an example.
Figure 1L:
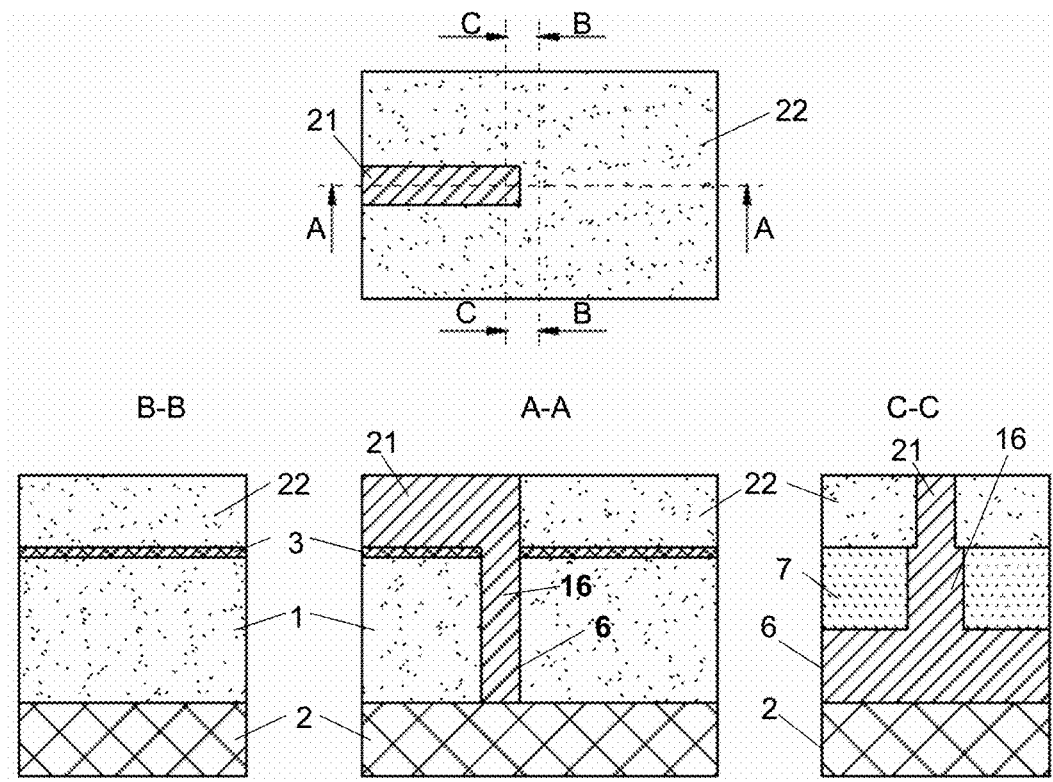

FIG. 1L illustrates a first r method embodiment, according w an example.

Figure 2A:
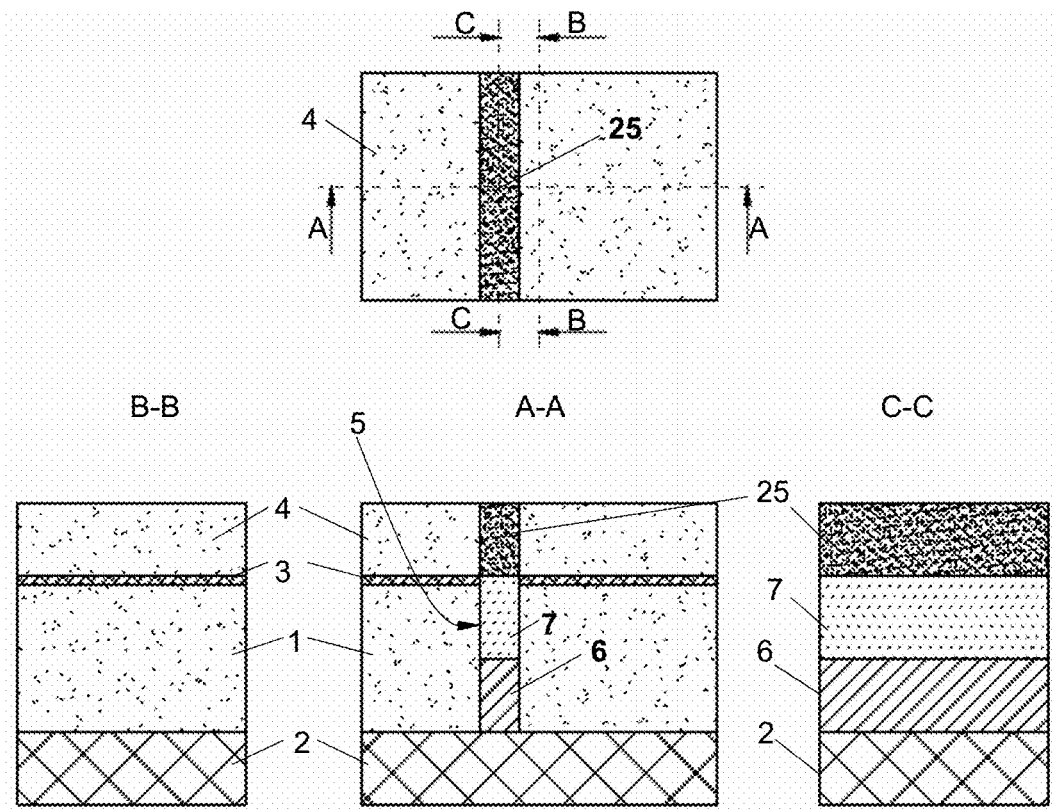

FIG. 2A illustrates a second method embodiment, according to an example.

Figure 2B:
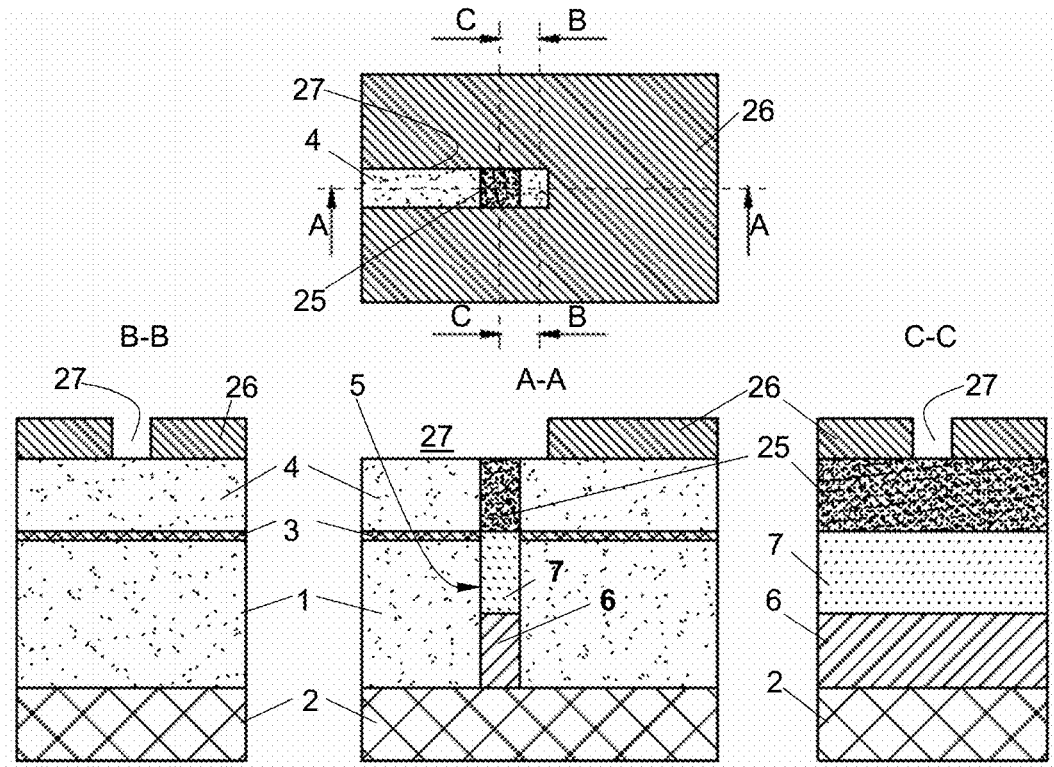
Figure 2C:
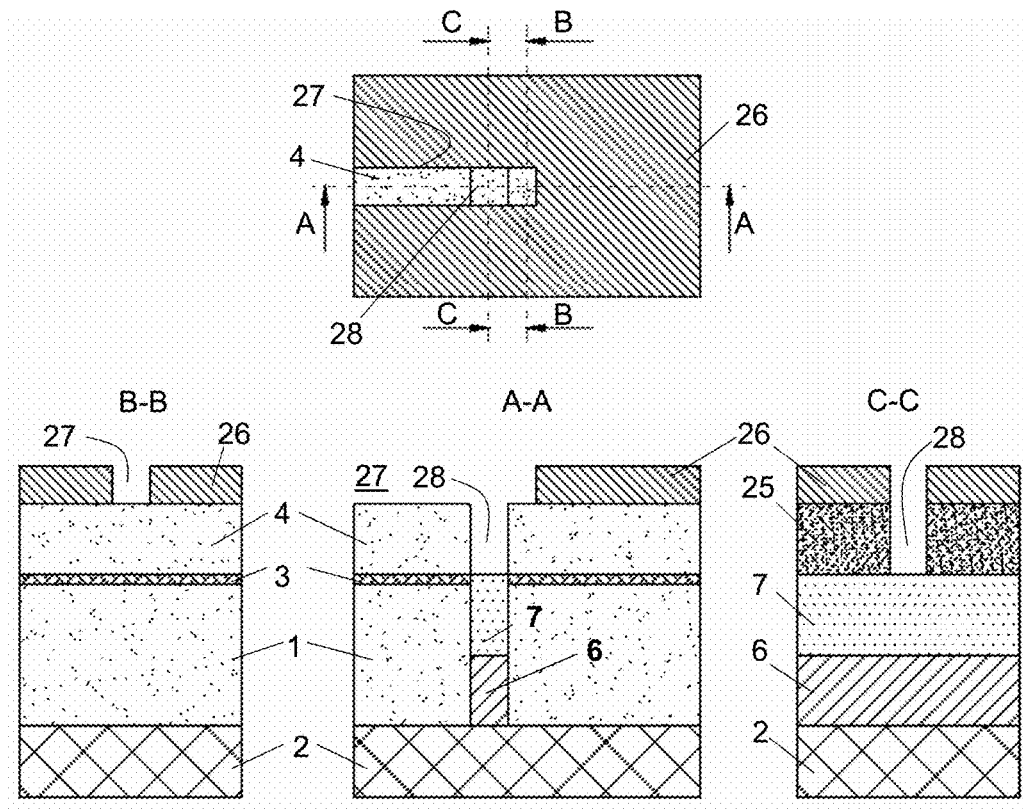

FIG. 2B illustrates a second method embodiment, according to an example,

FIG. 2C illustrates a second method embodiment, according to an example.

Figure 2D:
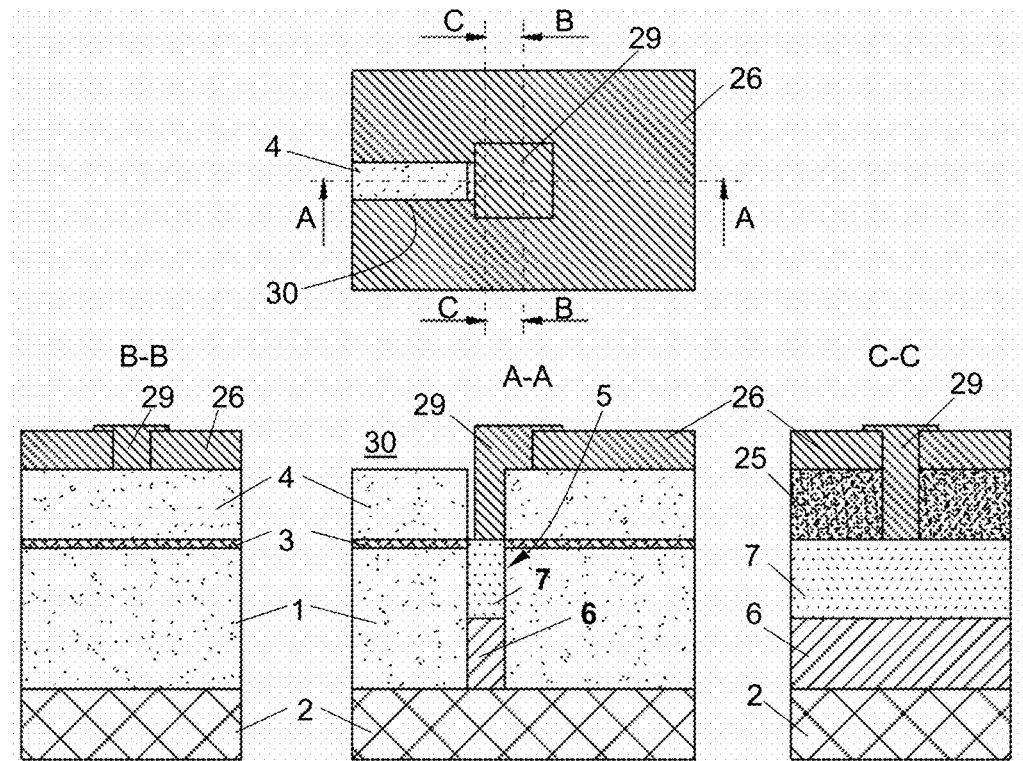

FIG. 2D illustrates a second method embodiment, according to an example.

Figure 2E:
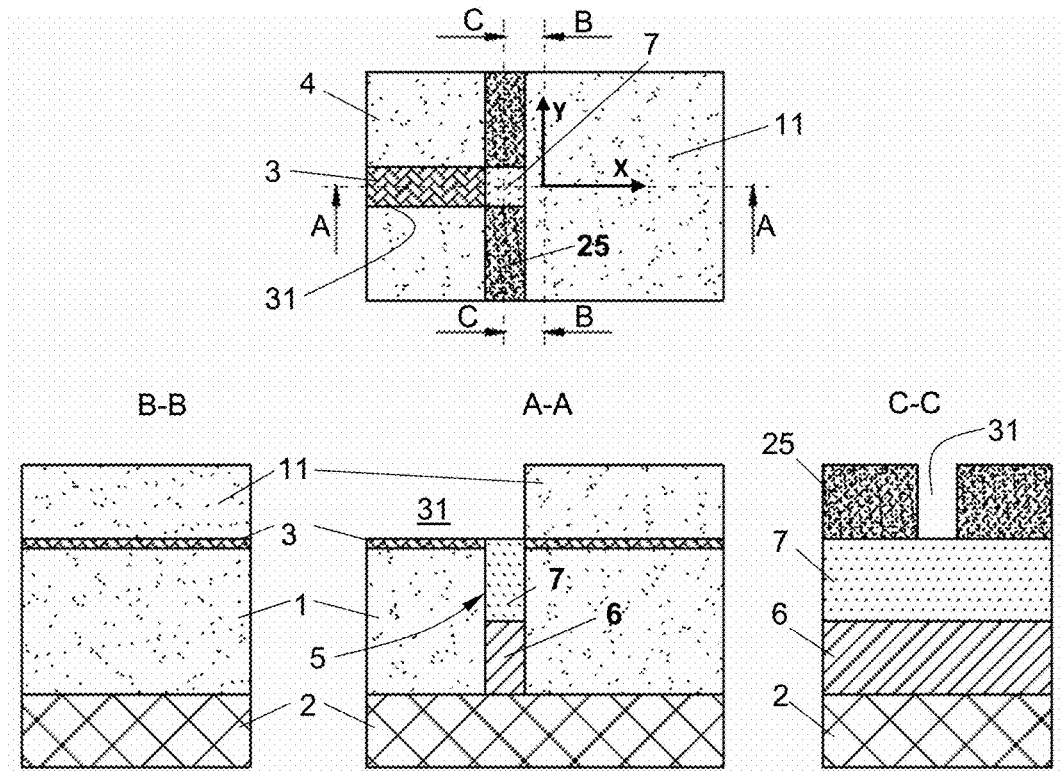

FIG. 2E illustrates a second method embodiment, according to an example.

Figure 2F:
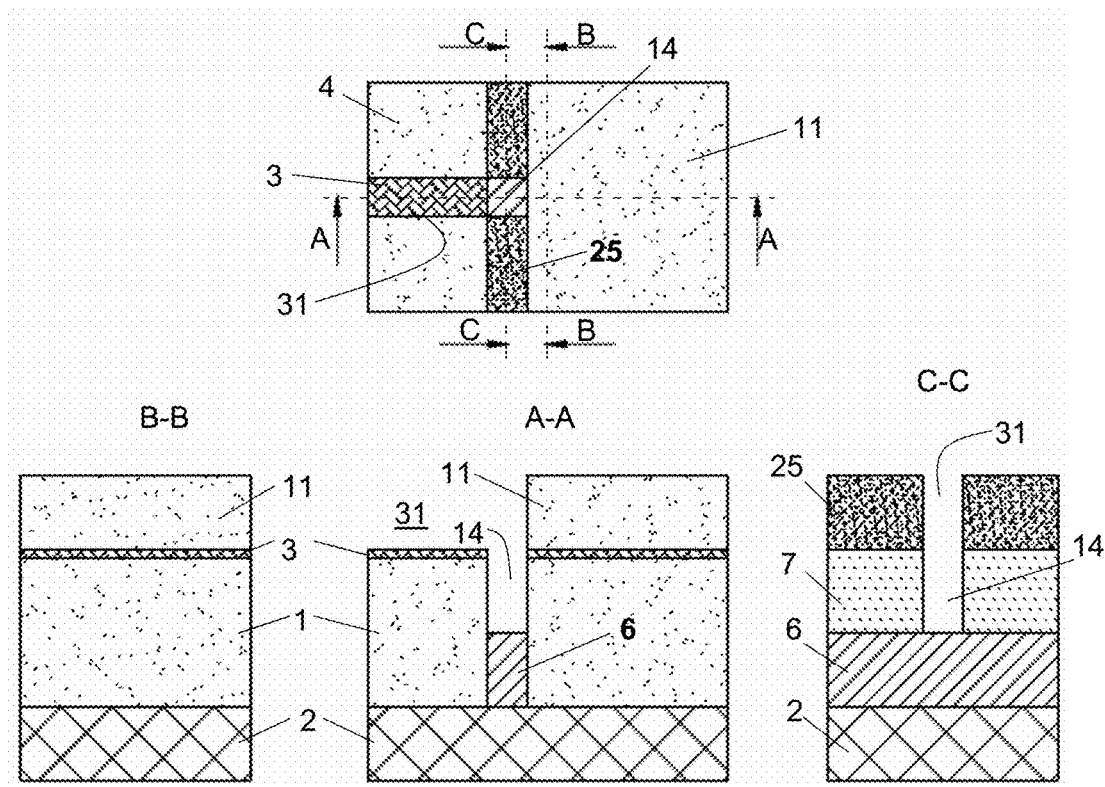

FIG. 2F illustrates a second method embodiment, according to an example.

Figure 2G:
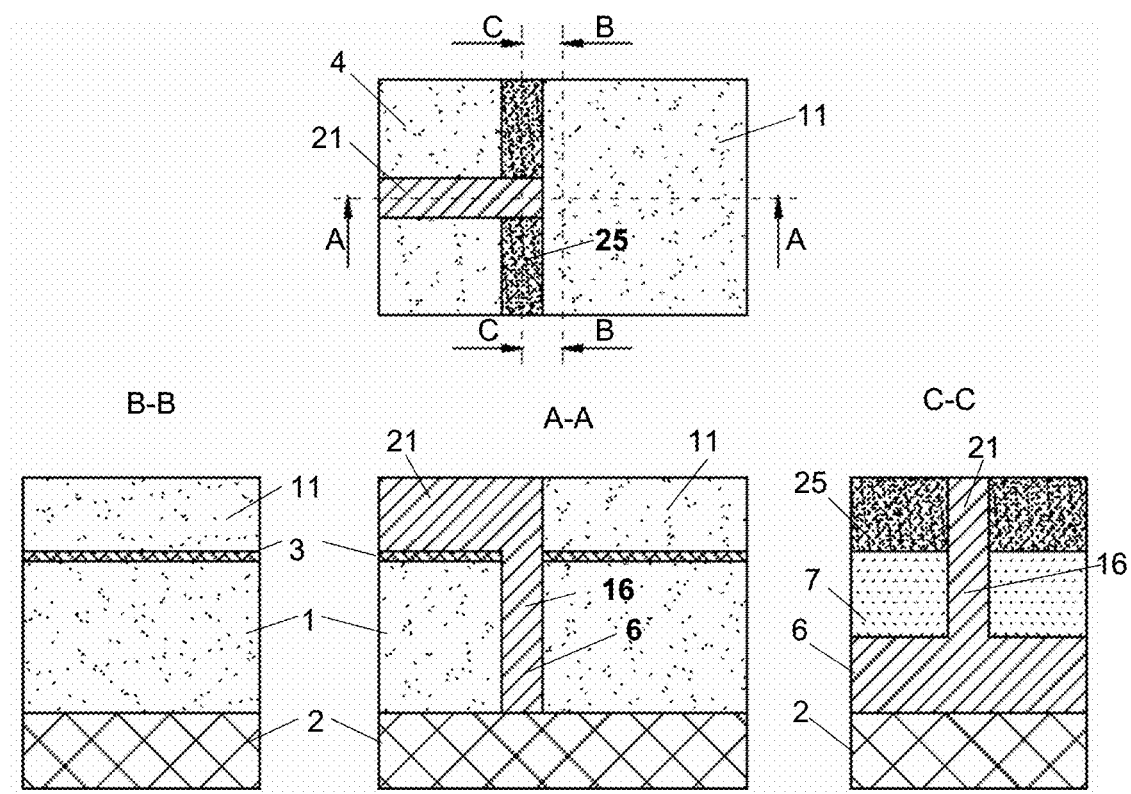

FIG. 2G illustrates a second method embodiment, according to an example.

Figure 3A:
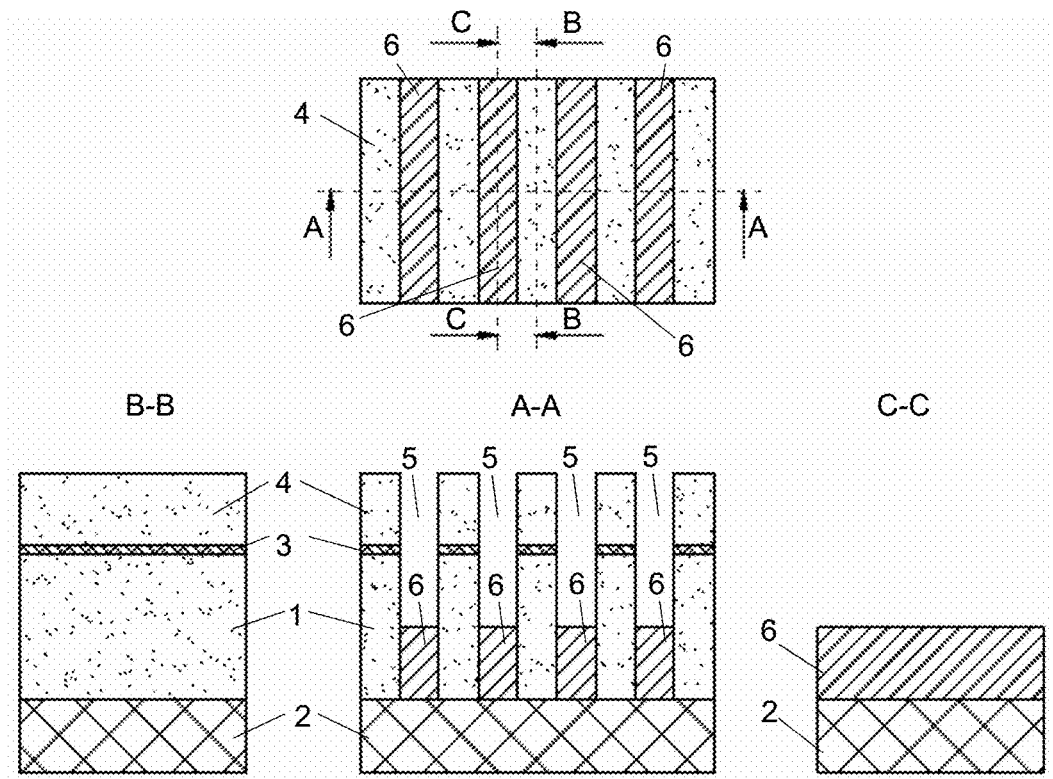

FIG. 3A illustrates the first method applied to produce two interconnect vias from the line ends of two collinear lines to underlying transverse and mutually parallel lines, according to an example.

Figure 3B:
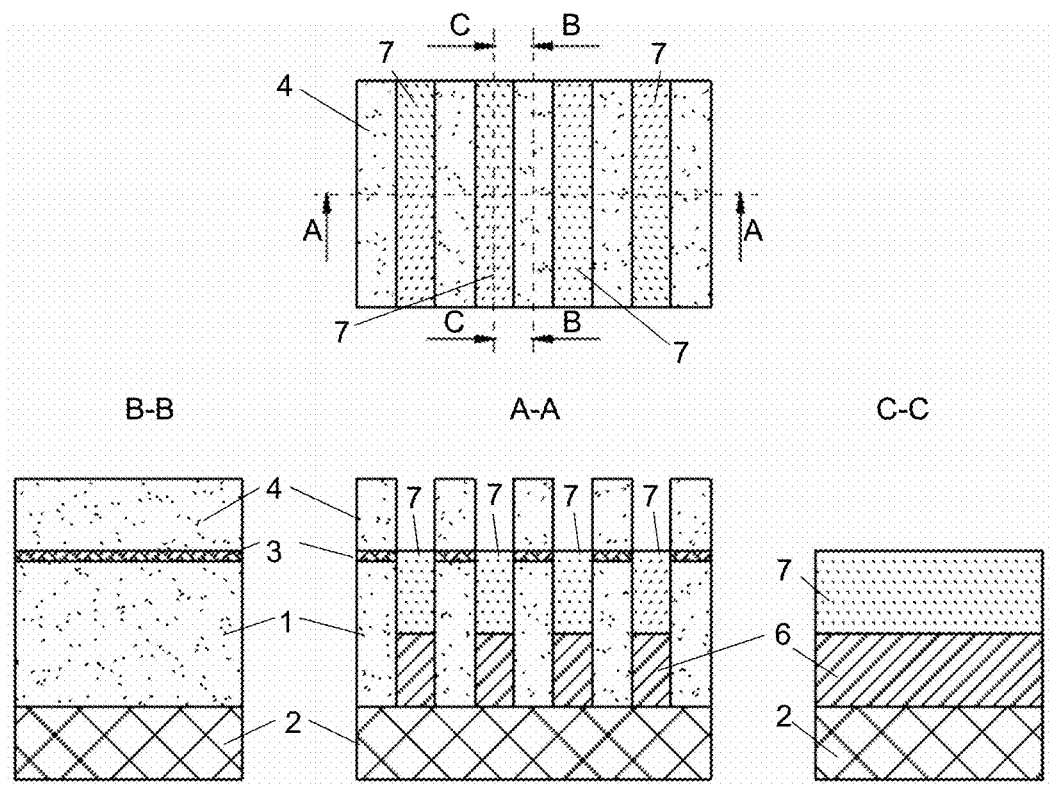

FIG. 3B illustrates the first method applied to produce two interconnect vias from the little ends of two collinear lines to underlying transverse and mutually parallel lines, according to an example.

Figure 3C:
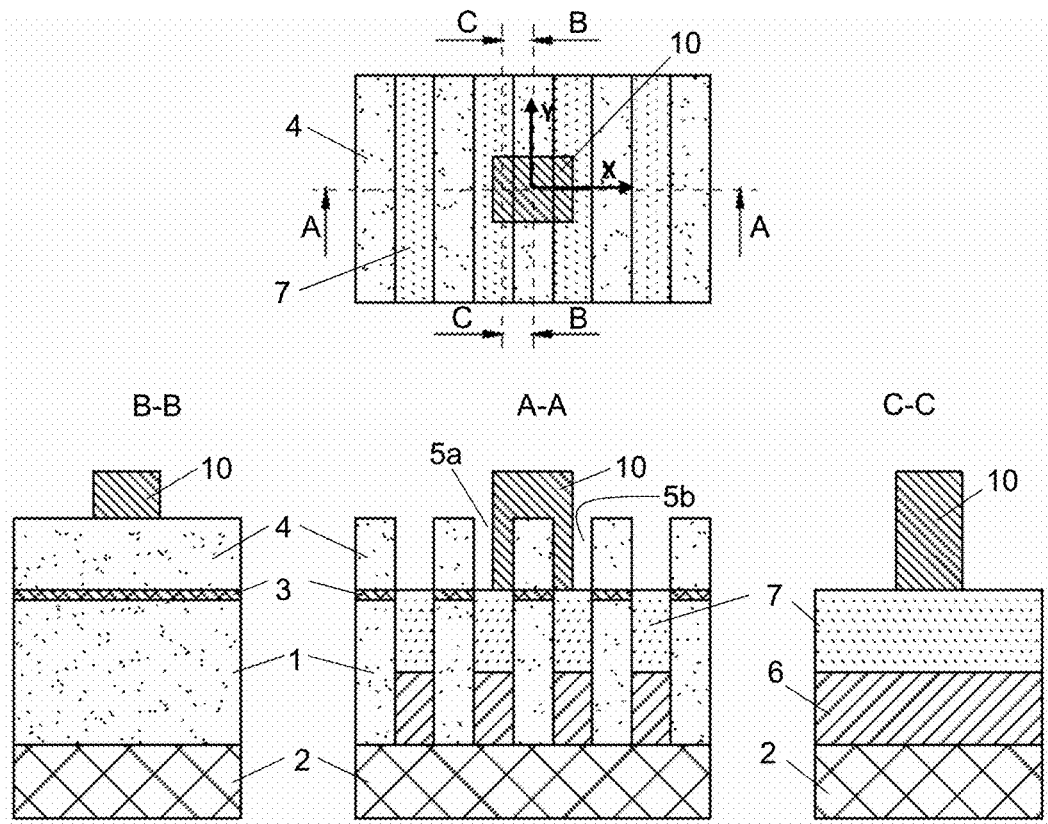

FIG. 3C illustrates the first method applied to produce two interconnect vias from the line ends of two collinear lines to underlying transverse and mutually parallel lines, according to an example.

Figure 3D:
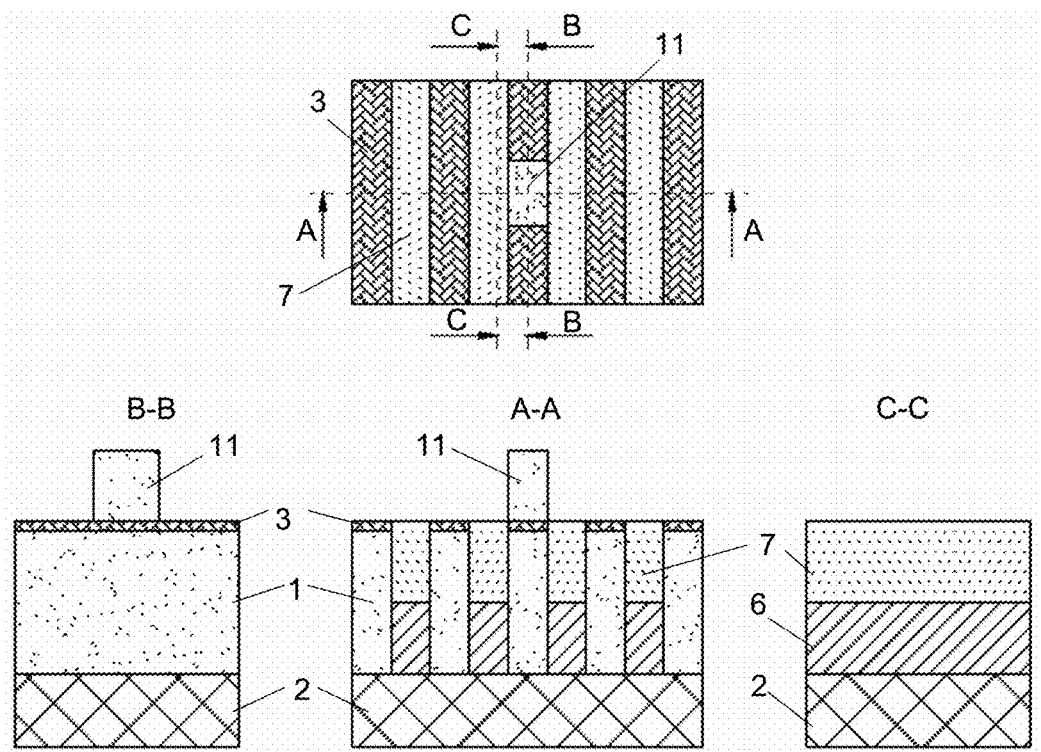

FIG. 3D illustrates the first method applied to produce two interconnect vias from the line ends of two collinear lines to underlying transverse and mutually parallel lines, according to an example.

Figure 3E:
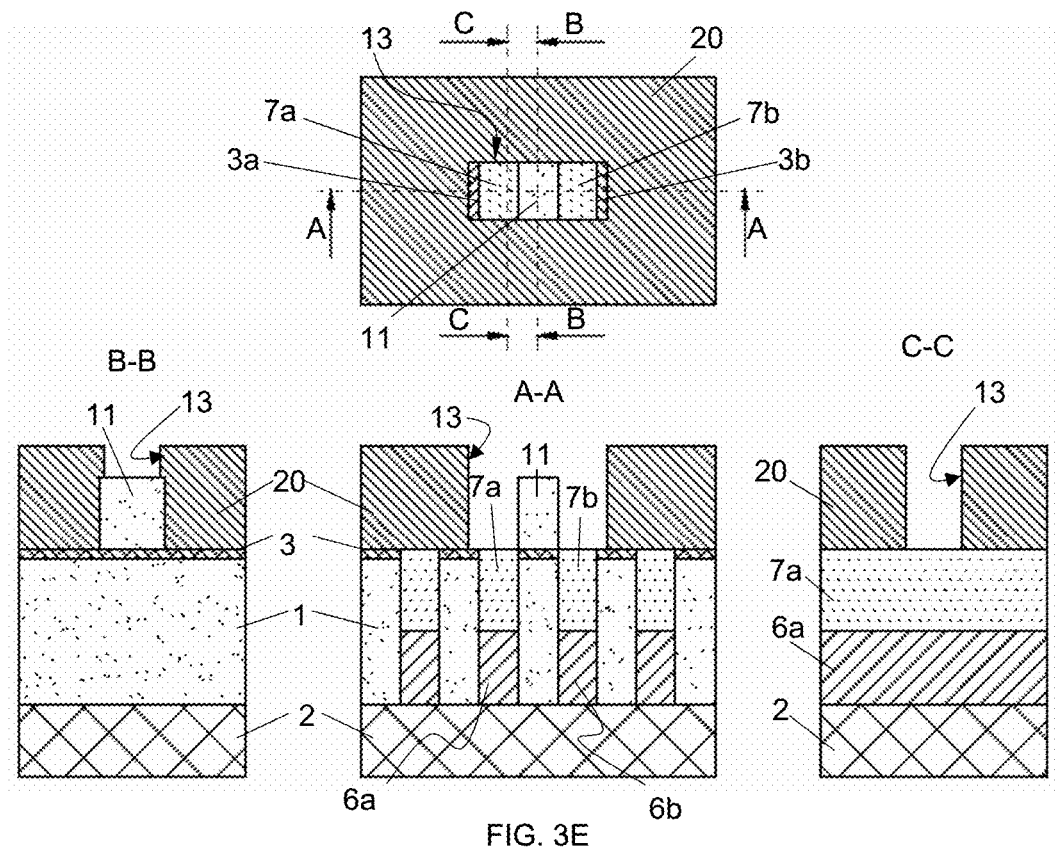

FIG. 3E illustrates the first method applied to produce two interconnect vias from the line ends of two collinear lines to underlying transverse and mutually parallel lines, according to an example.

Figure 3F:
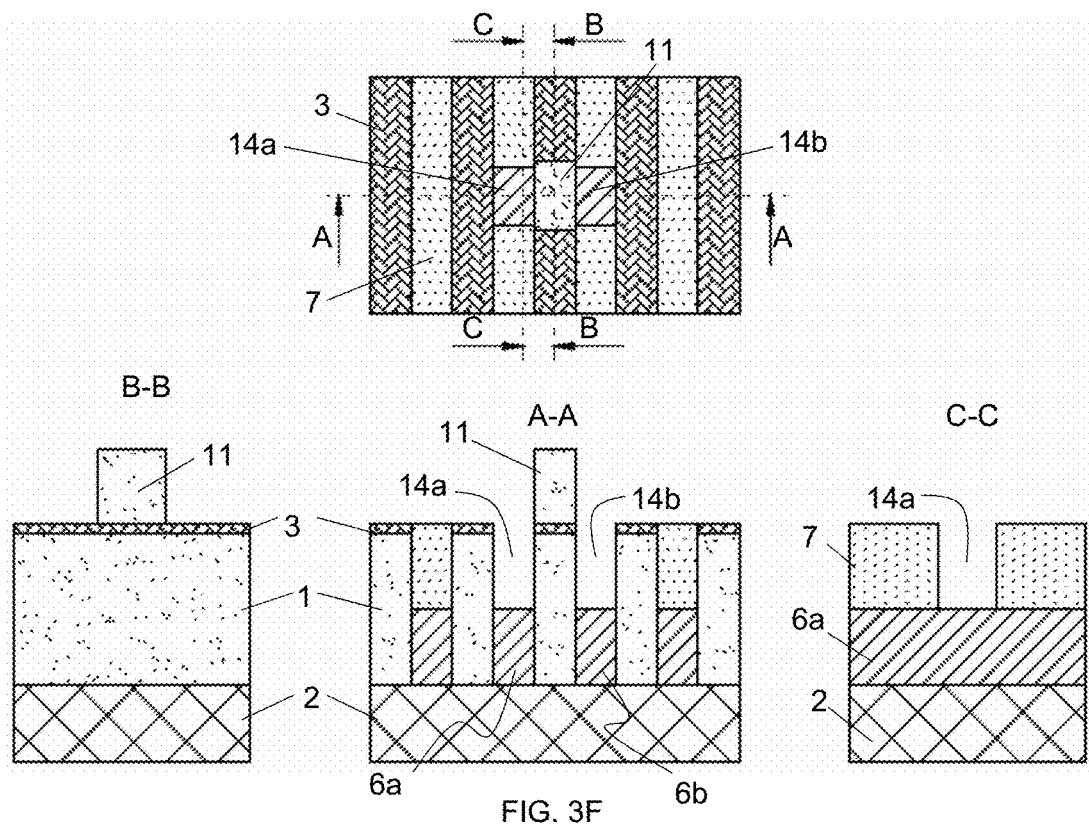

FIG. 3F illustrates the first method applied to produce two interconnect vias from the line ends of two collinear lines to underlying transverse and mutually parallel lines, according to an example.

Figure 3G:
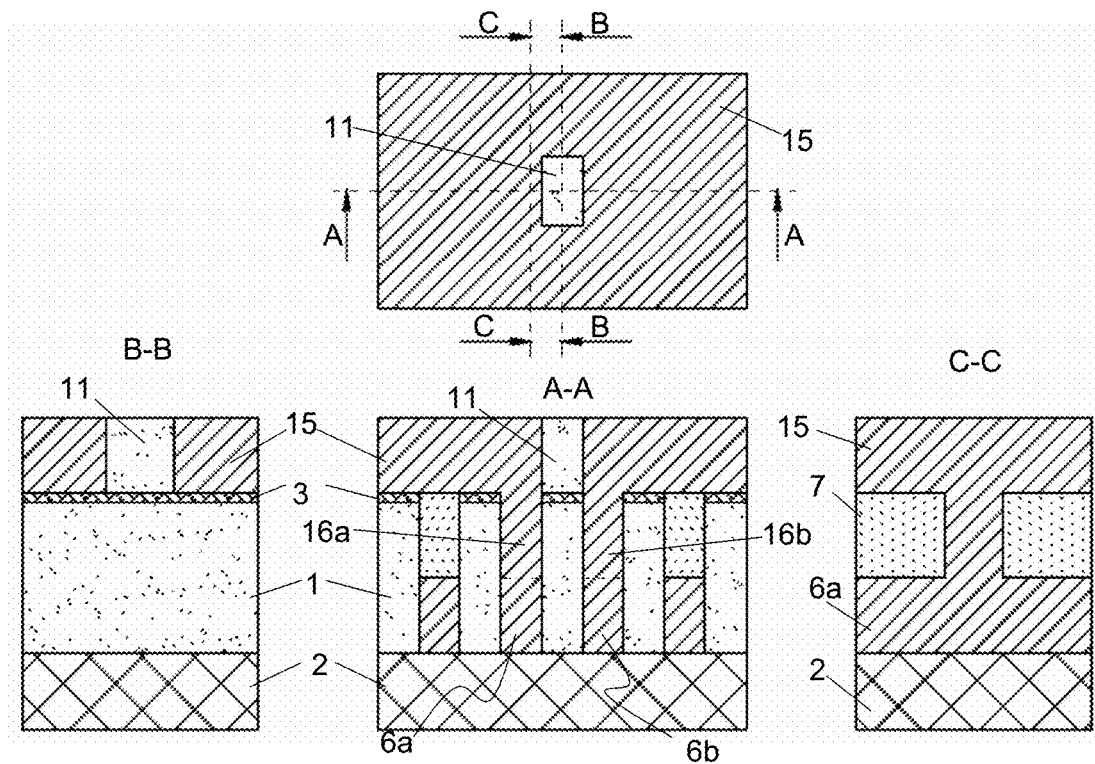

FIG. 3G illustrates the first method applied to produce two interconnect vias from the line ends of two collinear lines to underlying transverse and mutually parallel lines, according to an example.

Figure 3H:
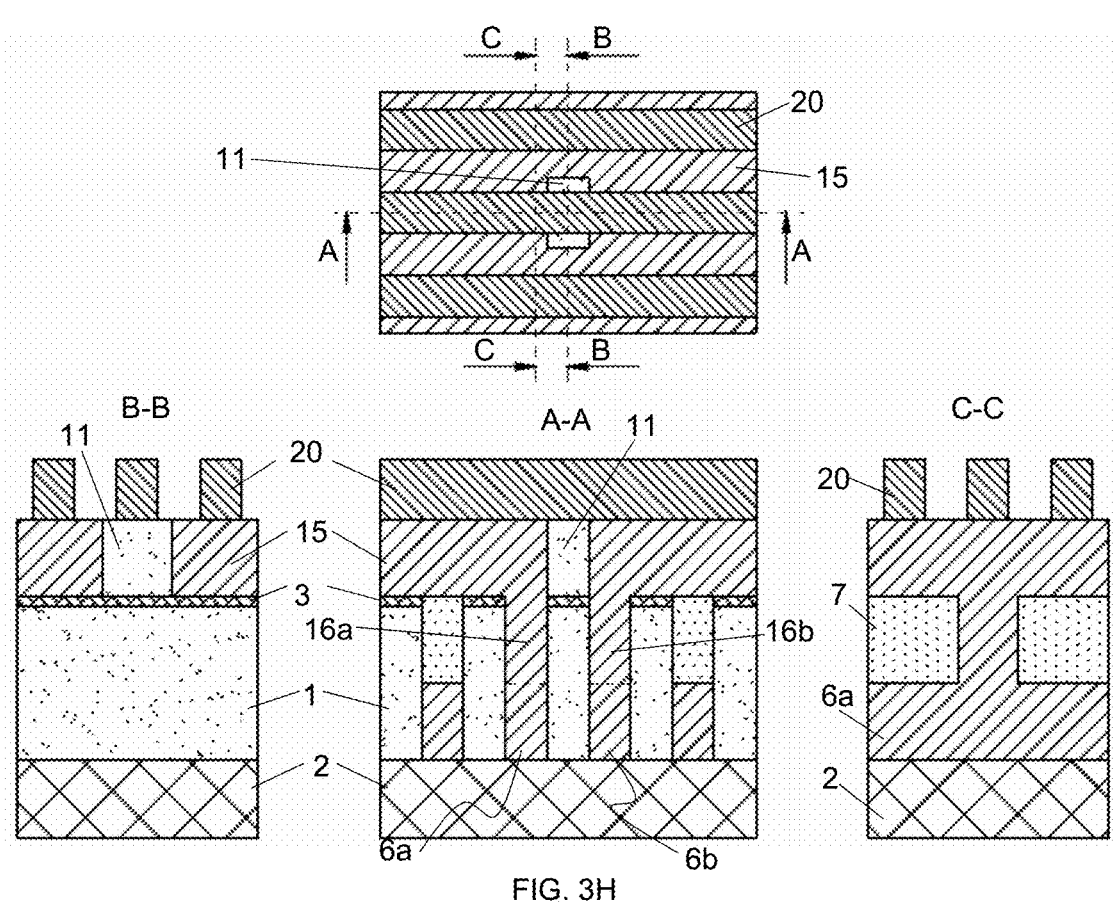
Figure 3I:
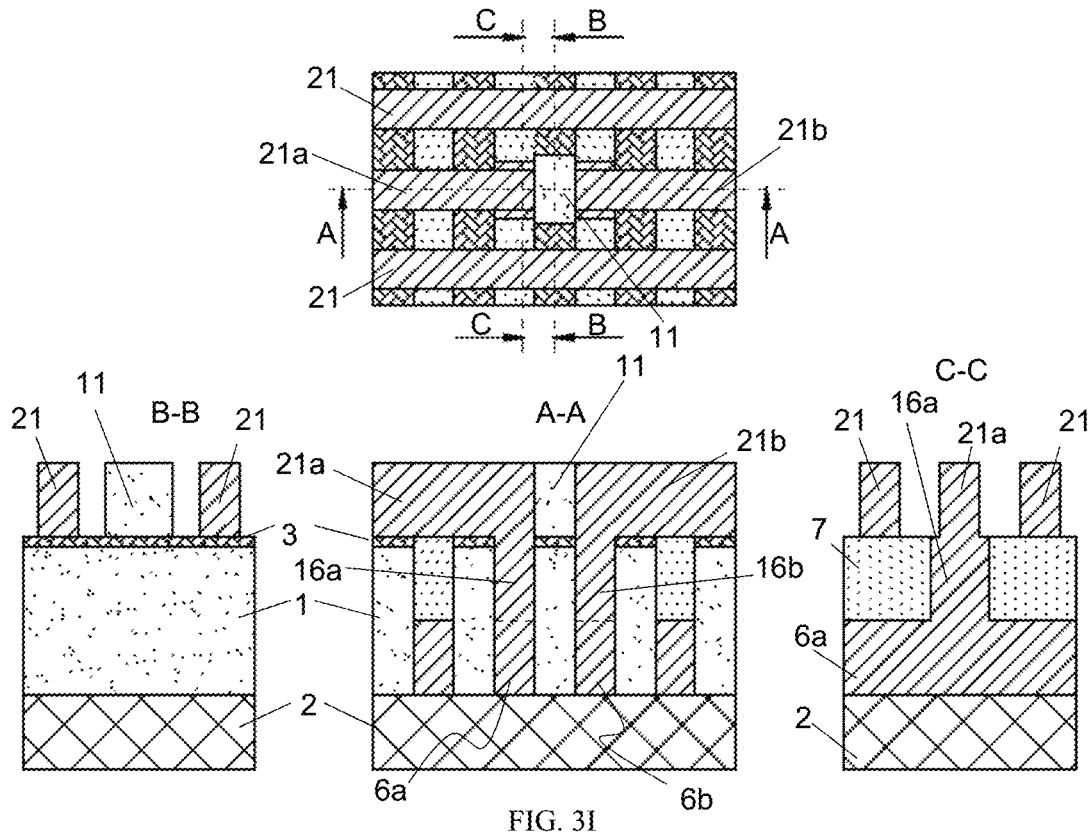

FIG. 3H illustrates the first method applied to produce two interconnect vias from the line ends of two collinear lines to underlying transverse and mutually parallel lines, according to an example, FIG. 3I illustrates the first method applied to produce two interconnect vias from the line ends of two collinear lines to underlying transverse and mutually parallel lines, according to an example.

Figure 3J:
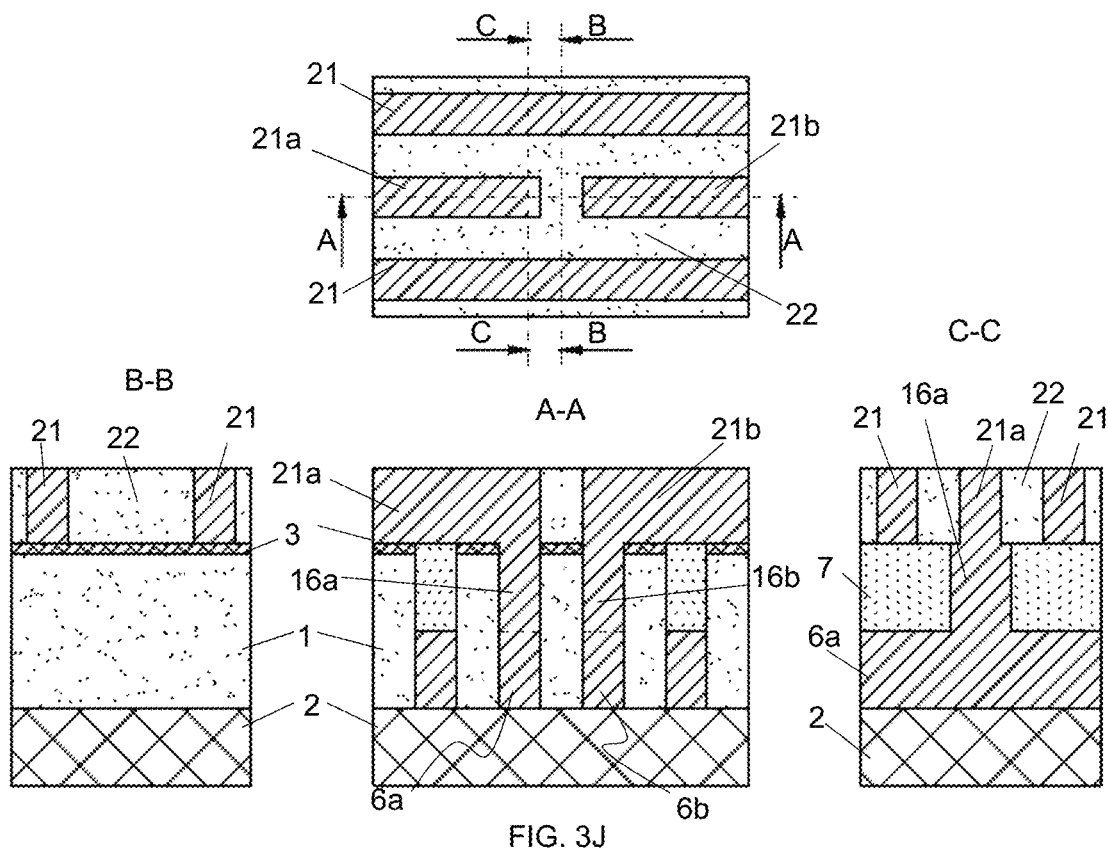

FIG. 3J illustrates the first method applied to produce two interconnect vias from the line ends of two collinear lines to underlying transverse and mutually parallel lines, according to an example.

Figure 4A:
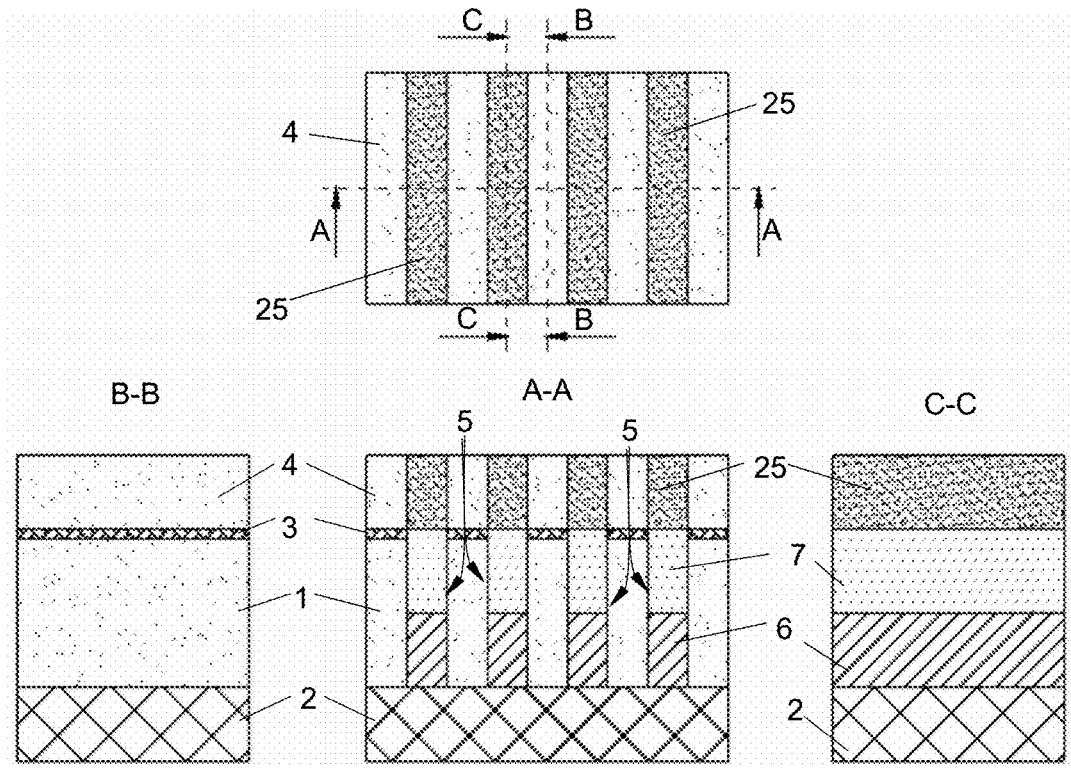

FIG. 4A illustrates the second method applied to produce two interconnect vias from the line ends of two collinear lines to underlying transverse and mutually parallel lines, according to an example.

Figure 4B:
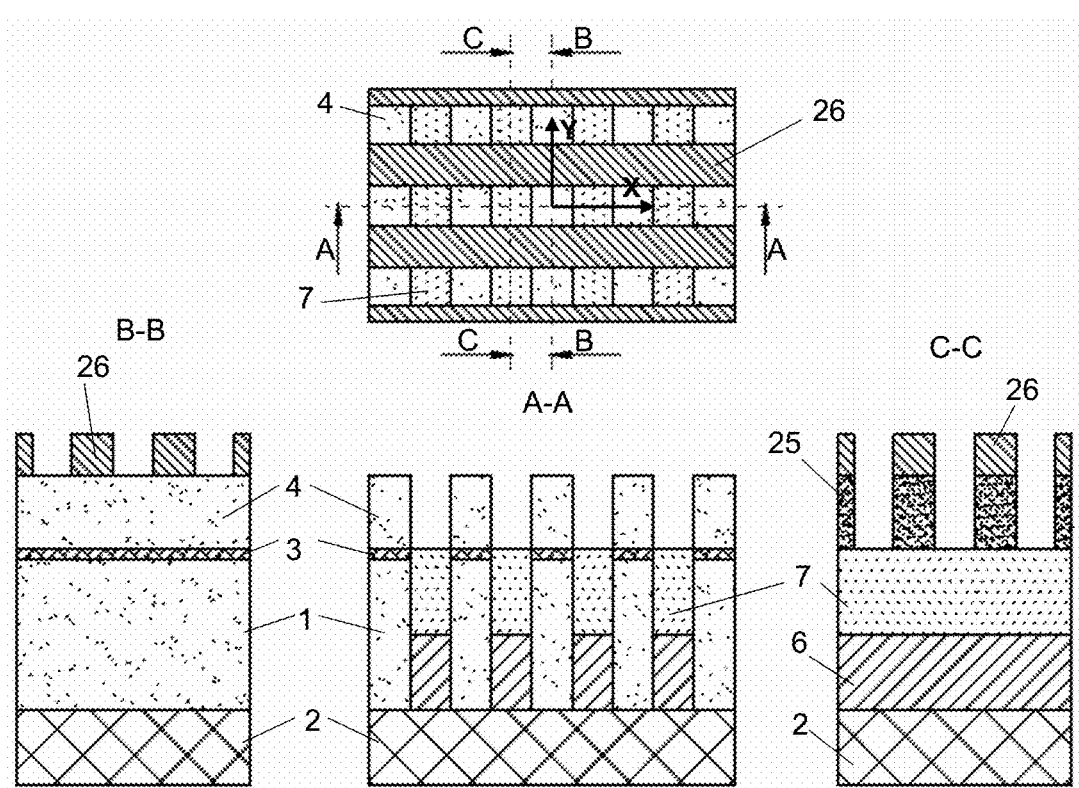

FIG. 4B illustrates the second method applied to produce two interconnect vias from the line ends of two collinear lines to underlying transverse and mutually parallel lines, according to an example.

Figure 4C:
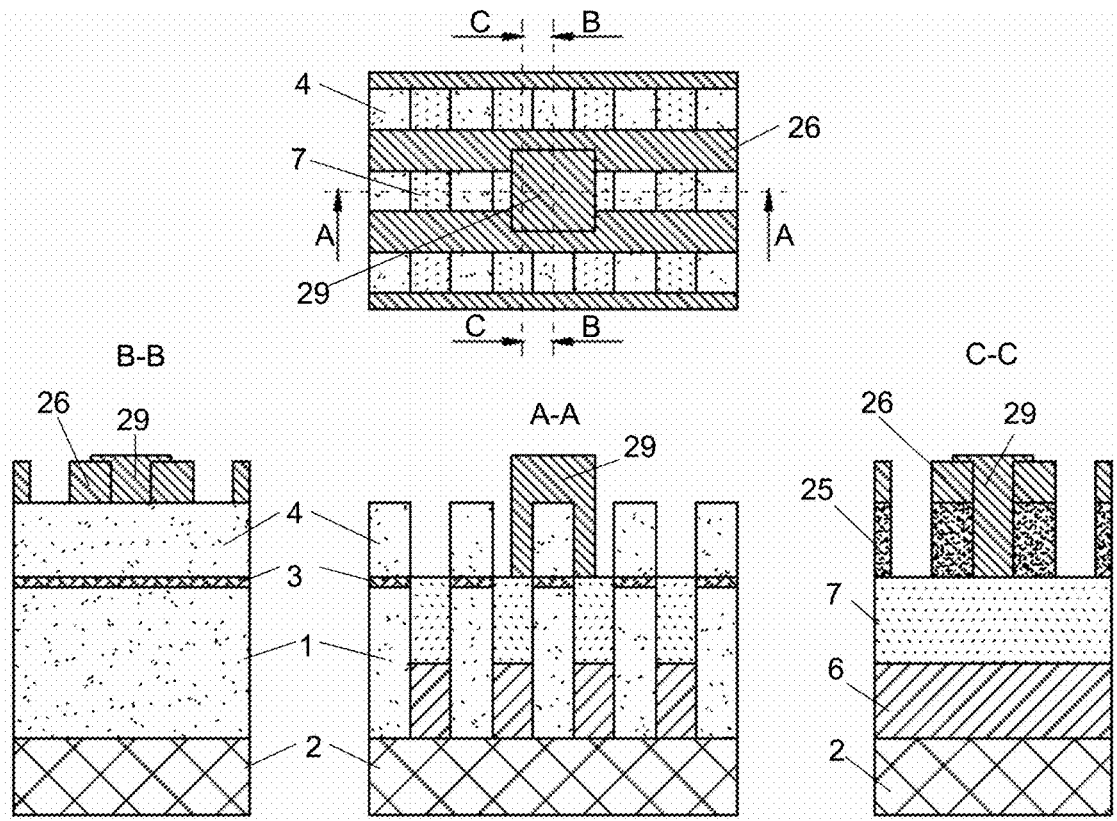

FIG. 4C illustrates the second method applied to produce two interconnect vias from. the line ends of two collinear lines to underlying transverse and mutually parallel lines, according to an example.

Figure 4D:
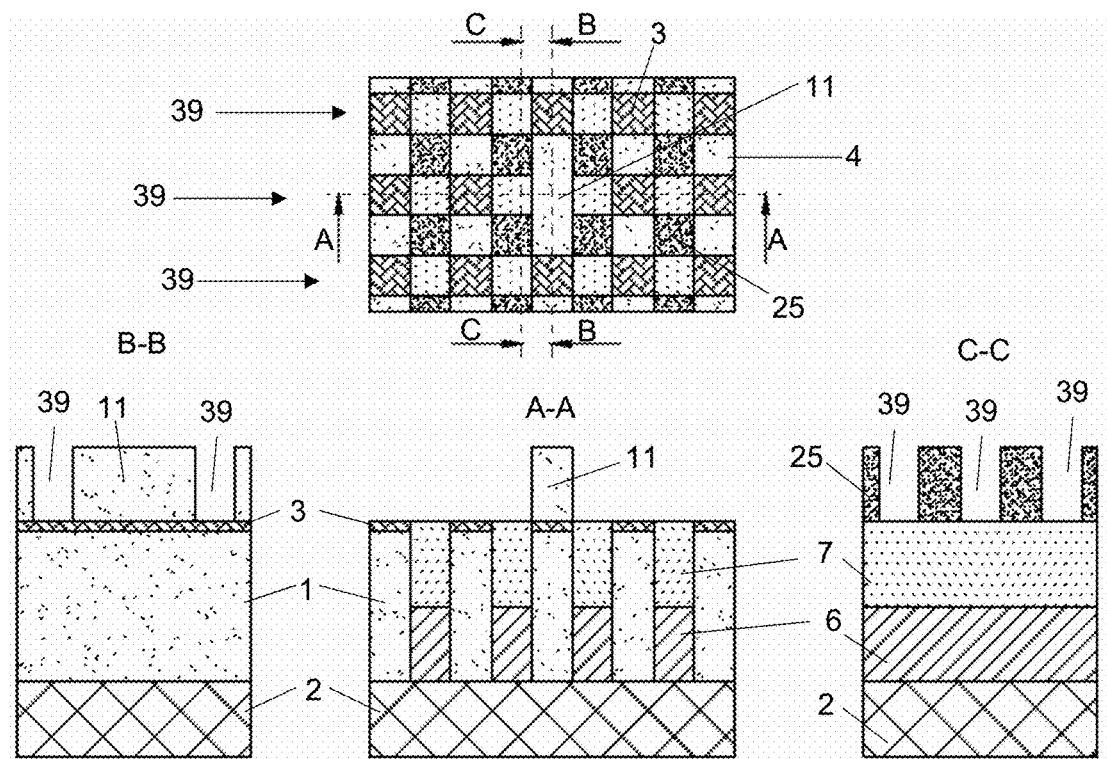

FIG. 4D illustrates the second method applied to produce two interconnect vias from the line ends of two collinear lines to underlying transverse and mutually parallel lines, according to an example.

Figure 4E:
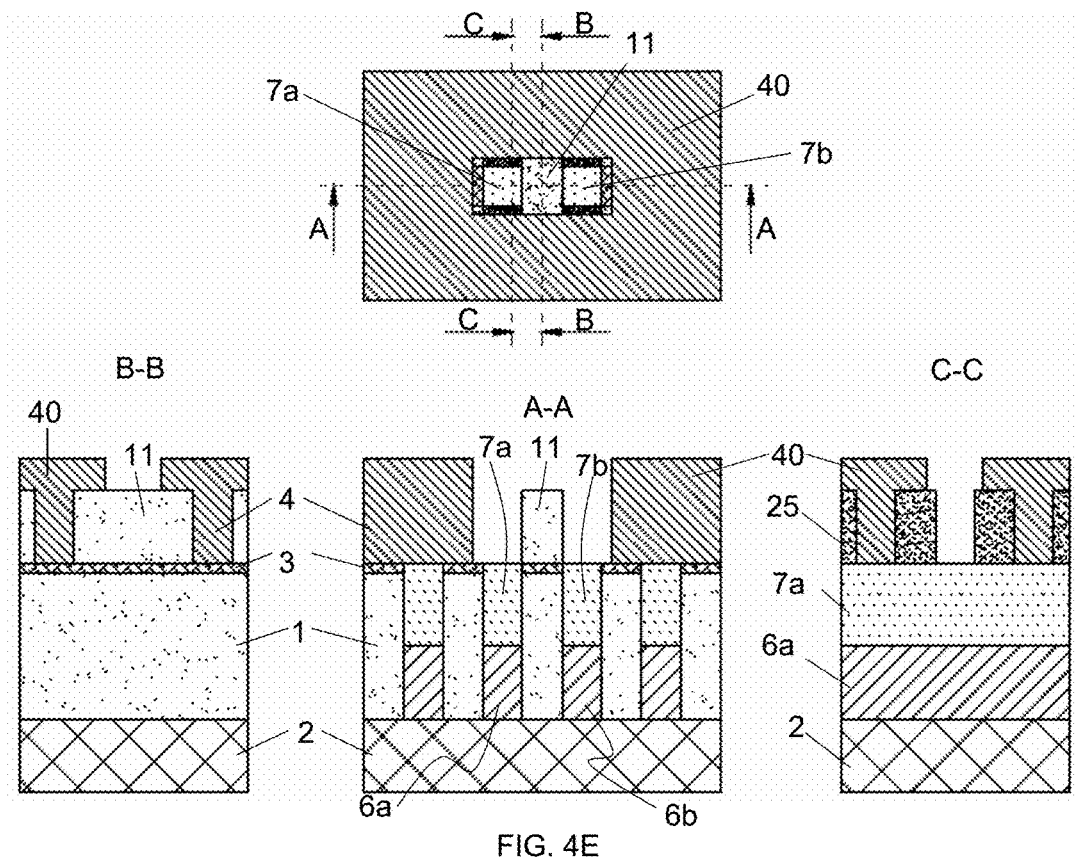

FIG. 4E illustrates the second method applied to produce two interconnect vias from the line ends of two collinear lines to underlying transverse and mutually parallel lines, according to an example.

Figure 4F:
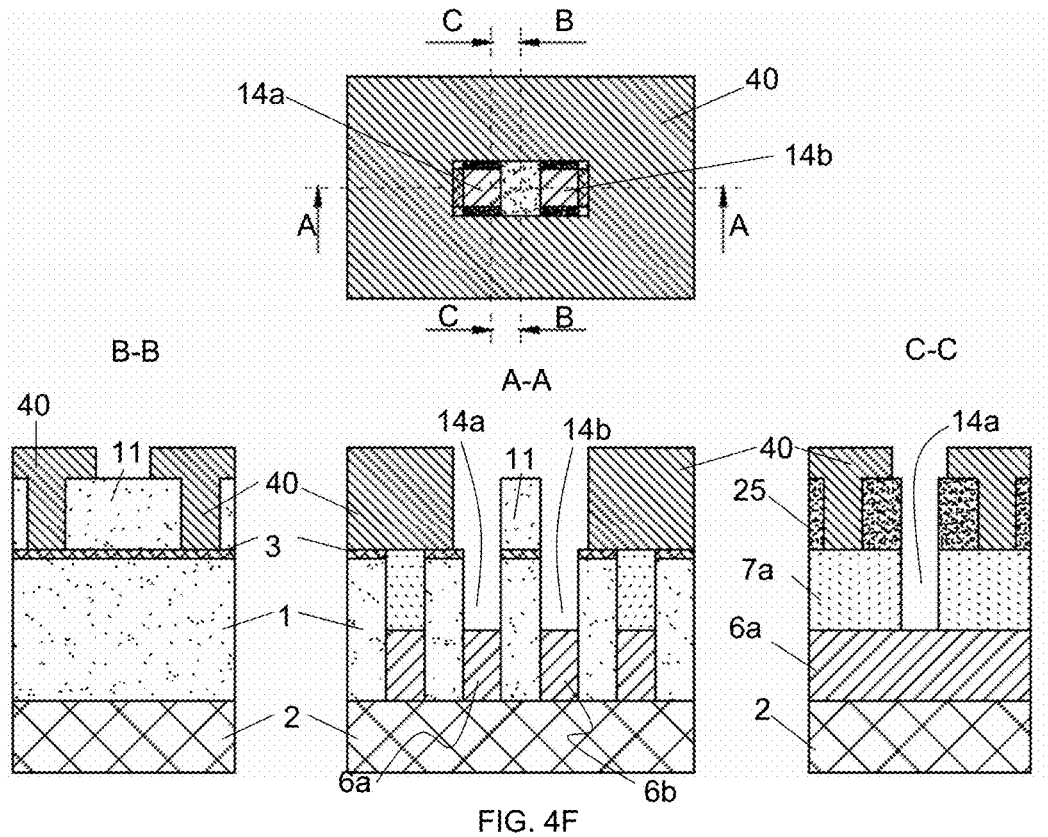

FIG. 4F illustrates the second method applied to produce two interconnect vias from the line ends of two collinear lines to underlying transverse and mutually parallel lines, according to an example.

Figure 4G:
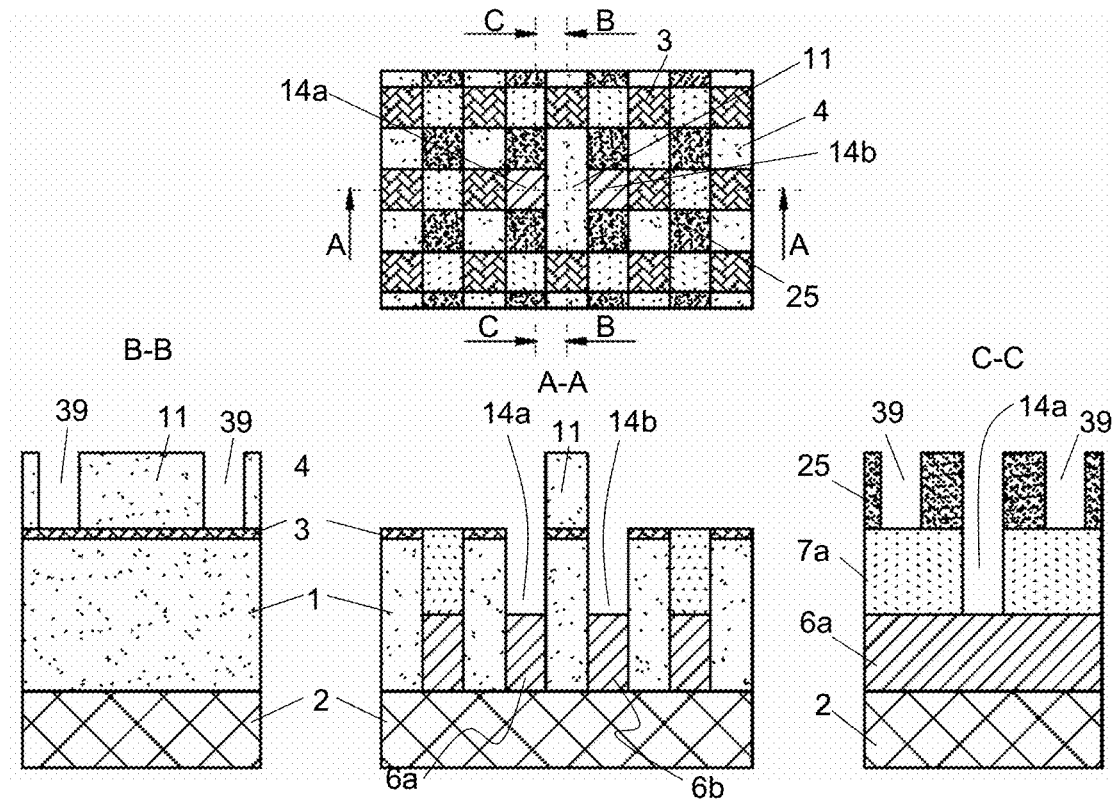

FIG. 4G illustrates the second method applied to produce two interconnect vias from the line ends of two collinear lines to underlying transverse and mutually parallel lines, according to an example.

Figure 4H:
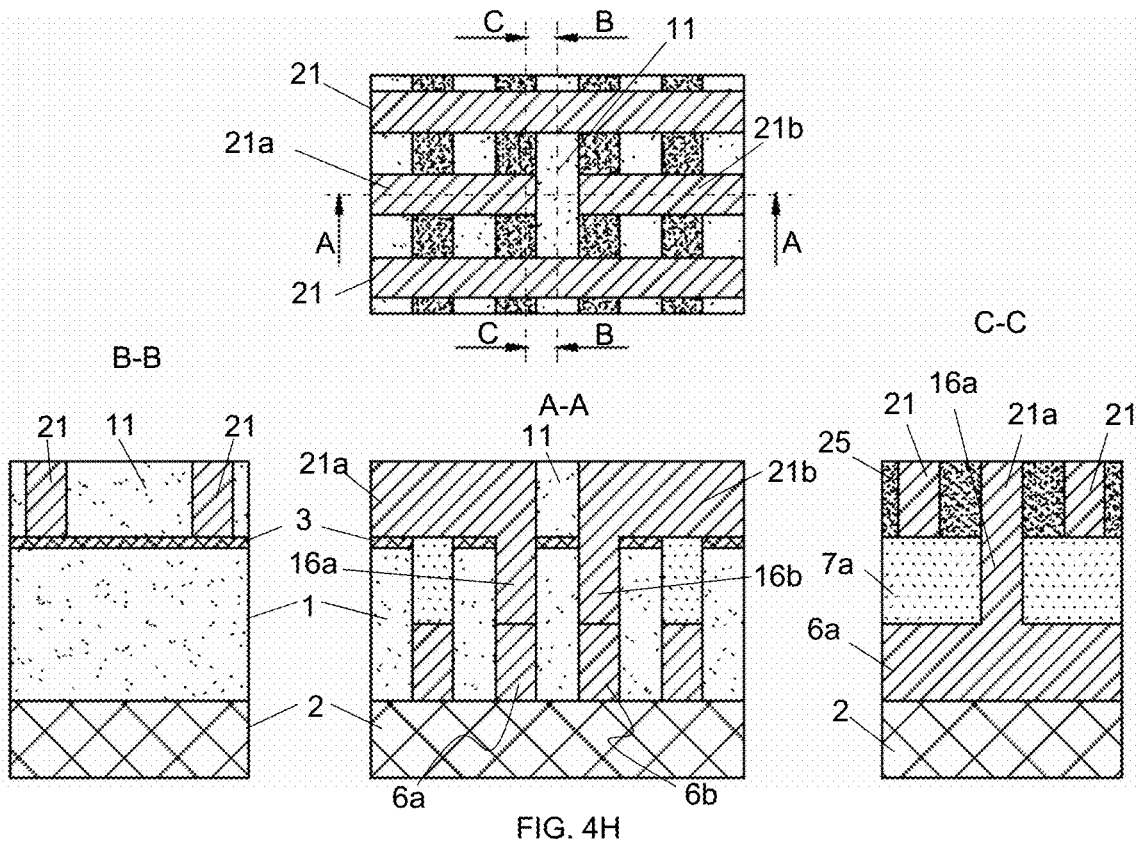

FIG. 4H illustrates the second method applied to produce two interconnect vias from the line ends of two collinear lines to underlying transverse and mutually parallel lines, according to an example.

Section views along planes A-A, B-B, and C-C indicated in the drawings show the sections as such, not what lies behind the section planes.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings.

That which, is encompassed by the claims may, however, be embodied in many different forms and should not be construed as limited to the embodiments set forth herein; rather, these embodiments are provided by way of example. Furthermore, like numbers refer to the same or similar elements or components throughout.

A first embodiment of the method of the disclosure is described with reference to FIGS. 1A to 1L. As shown in FIG. 1A, a layer 1 of a first interlayer dielectric material OLD) is deposited on a substrate 2. An etch stop layer 3 is deposited on top of the ILD layer 1, followed by a further layer 4 of the first ILD 1. The ILD material of the top layer 4 could however be a different ILD material than the material of layer The etch stopping function of the etch stop layer 3 is relative to an etch recipe for etching the ILD material of the top layer 4, i.e. the first ILD material in this case. The first ILD material of layers 1 and 4 could be SiCO. The etch stop layer 3 could be a layer of SiN. When these materials are used, the thickness of layer 1 could be about 20 nm the thickness of layer 3 could be about 10 nm and the thickness of layer 4 could be about 20 nm. These materials and thicknesses are however merely examples. Depending on the material choice, and as depicted in the drawings, the etch stop layer 3 can be thinner relative to the ILD layers 1 and 4 than in the above example. The images show a top view and cross sections of a small portion of the substrate 2 and the layers 1, 3, and 4, the portion being configured to contain the specific construct of conductive lines coupled by a via, to be processed in accordance with the disclosure.

The substrate 2 could be a device wafer, i.e. a wafer comprising several integrated circuit chips, each chip comprising a large number of semiconductor devices, for example transistors arranged in multiple 2-dimensional standard logic cell arrangements. The aim is then to form a lower metal level M0 comprising conductive lines connected directly to the semiconductor devices according to a predefined connection design, and above M0 an upper metal level M1 comprising conductive lines miming transversely to the M0 lines and connected to the M0 lines by multiple via interconnects. The method of the disclosure is suitable for producing such a construct, not only at the deep levels M0-M1 of the back end of line (BEOL) interconnect structure of an integrated circuit, but at any pair of consecutive levels located. anywhere in the BEOL stack. So generally, the substrate 2 could be a device wafer including a partially processed BEOL stack, the top level corresponding to level $M_{x-1}$. The method of the disclosure is then applicable for producing levels $M_x$ and $M_{x+1}$, interconnected by interconnect vias between the two.

Especially at the deeper levels, the conductive lines are arranged in closely spaced arrays of parallel lines, and an example of applying the method of the disclosure to such an arrangement is given further in this description, wherein it is demonstrated that the method of the disclosure can facilitate a very tight tip-to-tip spacing between two collinear lines in the upper level, the line ends of the collinear lines being connected by self-aligned interconnect vias to two adjacent parallel lines in the lower level. However In order to focus on the main characteristics, an embodiment is first described wherein a single lower metal line of a lower level $M_x$ is connected to a single upper metal line of upper level $M_{x+1}$ by a single metal interconnect via. Any electrically conductive material is applicable apart from a metal, but metal interconnects are most widely used and are therefore applied in the context of the detailed description.

The combined thickness of the layer I of the first ILD and the etch stop layer 3 corresponds to the combined thickness of the eventual lower interconnect level $M_x$ and the height of the interconnect via. The top layer 4 is for example somewhat higher than the eventual thickness of the upper level $M_{x+1}$ in order to take into account a degree of thinning of this layer 4 during multiple planarization and/or etch steps performed during the method (see further).

As illustrated in FIG. 1B, a trench 5 is formed in the stack of layers 1, 3, and 4 and filled with a metal, for example Cu, Ru, or Co, after which the metal in the trench is recessed to form the lower conductive line 6. Etching of the trench 5 requires different etch recipes, as the etch takes place through different materials, namely the first ILD material (layers 1 and 4), and the etch stop layer 3. Etch recipes as such for etching, suitable materials for these layers (as in the example mentioned above) are known and not detailed here. Due to the use of different etch recipes, the walls of the trench 5 may slightly differ from the straight walls illustrated in the drawings.

The recessing of the metal in the trench 5 may be done by standard lithography and etching, using a first hardmask (not shown) that defines the position of the trench 5. After stripping the first mask, metal is deposited in the trench 5 and on the surface of the ILD layer 4, the metal deposition being possibly preceded by the formation of a diffusion harrier (not shown) conformally in the trench 5. Chemical mechanical polishing may be used to planarize the deposited metal to become level with the upper surface of the top ILD layer 4, possibly slightly thinning the ILD layer 4. Recessing the metal may be done by dry or wet etching using a suitable etch recipe that removes the metal relative to the ILD layers 1 and 4 and relative to the etch stop layer 3. A timed etch may be used to stop the etch process when the desired thickness of the lower line 6 is reached. What remains is the trench 5 with the line 6 at its bottom, as shown in FIG. 1B. An alternative way of producing the line 6 is by depositing metal only at the bottom of the trench 5, by a local deposition technique such as area-selective atomic layer deposition (ALD) wherein a layer of metal is built from the bottom up, starting from the bottom of the trench 5, until reaching the desired line thickness.

As illustrated in FIGS. 1C and ID, the trench 5 is filled (i.e. the portion of the trench above the line 6), with a second ILD material 7 different from the first ILD material after which the second ILD material 7 is recessed in the trench 5. An alternative way of producing the layer 7 of FIG. 1D is to deposit the second ILD material locally on top of the metal line 6 in the trench, and building up the layer 7 from the bottom up, for example by area-selective ALD, until reaching the desired thickness of the layer 7. In the embodiment shown, this thickness is such that the upper surface of layer 7 is at the same level as the upper surface of the etch stop layer 3. Depending on the materials chosen and the applicable embodiment (layer 7 can be present according to any embodiment of the disclosure), the upper surface of layer 7 may be lower or higher than the etch stop layer 3, or between the upper and lower surface of the etch stop layer 3. According to an embodiment, the upper surface of the recessed layer 7 is slightly higher than the upper level of the etch stop layer 3.

The second ILD material 7 is chosen on the basis of etch selectivity with respect to the ILD material of the top layer 4 and with respect to the etch stop layer 3. To be more precise, etch recipes should be available by which it is possible to:

etch the ILD material of the top layer 4 selectively with respect to the second ILD material and vice versa, i.e. the one material can serve as a mask for anisotropic etching of the other and etch the second ILD material of 7 selectively with respect to the etch stop layer 3 i.e. the etch stop layer can serve as a mask for anisotropic etching of the second ILD material.

The nature of these etch recipes is known for various choices of the ILD materials and the etch stop material, and are therefore not detailed in this description. The result in FIG. 1D can be obtained by depositing a layer of the second ILD material 7 that fills the trench 5 and covers the upper ILD layer 4, followed by thinning and planarizing the layer by CMP to the upper level of the first ILD material of layer 4 (possibly slightly thinning the latter) to arrive at the situation shown in FIG. 1c, and recessing the second ILD material 7 in the trench by a timed wet or dry etch, using one of the above-referenced selective etch recipes. When the first ILD material is SiCO, the second ILD material can be $SiO_2$.

Then, as shown in FIG. 1E, a second hardmask 10 is formed, partially covering the trench 5, as well as covering a portion of the upper ILD layer 4 to one side of the trench 5. This is followed by anisotropic etching of the first ILD material of layer 4, stopping on the etch stop layer 3, and by stripping of the hardmask 10, resulting in the situation shown in FIG. 1F. A local pillar 11 of the first ILD material remains, to one side of the trench 5, and perfectly aligned with the ethic of the trench.

A third hardmask 12 is now formed, as shown in FIG. 1G, covering the etch stop layer 3 around the remaining pillar 11, except for an opening 13 which overlaps both the trench 5 and the remaining pillar 11. In the vertical direction (the Y-direction of the X-Y orthogonal axes indicated in the drawing), the opening is more narrow than the pillar 11. In the X-direction, the opening exposes the full width of the trench 5 and the pillar 11, and a portion of the etch stop layer 3 on either side thereof.

Now, an anisotropic etch process is applied that removes the second ILD material 7 relative to the first ILD material of the pillar 11 and relative to the etch stop layer 3, and stopping on the metal line 6 (either by a timed etch or through etch selectivity relative to the metal of line 6), resulting in the creation of a via opening 14 in the trench 5, after which the third mask 12 is stripped, see FIG. 1H. The via opening is therefore created using the mask 12, the pillar 11, and the etch stop layer 3 as mask material. The via opening 14 is self-aligned to the side of the pillar 11 in the V-direction, i.e. along the longitudinal direction of the trench S. In the X-direction, the via opening 14 is self-aligned to the width of the conductive line 6.

Then a metal layer 15 is deposited over the entire surface of the etch stop layer 3 (FIG. 1I). The metal tills the via opening 14, thereby creating the interconnect via 16 that is self-aligned to the width of the lower conductive line 6. The metal layer 15 is planarized to the height of the pillar 11 formed of the first ILD material (possibly slightly reducing the height of this pillar).

Then a fourth hardmask 20 is applied that defines the width of the upper conductive line, as shown in FIG. 1J. The mask 20 covers the planarized metal layer IS along a line which fully overlaps the trench 5 and which partially overlaps the pillar 11. The metal layer 15 is anistropically etched, selectively with respect to the pillar 11, and stopping on the etch stop layer 3 and on the layer 7 of the second ILD material. If the upper surface of the layer 7 is not at the same level as the upper surface of the etch stop layer, the etch of the metal 15 continues at least until all metal is removed from the top of the layer 7.

Then the fourth hardmask 20 is stripped (see FIG. 1K), leading to the desired metal construct, comprising a lower line 6, an interconnect via 16 and an upper line 21. The interconnect via 16 is self-aligned to the width of the lower line 6 and to the line end of the upper line 21. Finally, the upper line 21 is embedded in an additional layer 22 of the first ILD material, see FIG. IL, which is planarized to the level of the upper line 22. Layer 22 could also be another ILD material than the first.

According to a second embodiment, the same construct is produced, but now the interconnect via is fully aligned to the lower and upper conductive lines, in both the X and Y directions. To do this, a third interlayer dielectric material is helpful. The third ILD material should be etchable selectively with respect to the ILD material of the top layer 4, i.e. the top layer 4 can serve as a mask for anistropically etching the third ILD material. Furthermore, the second ILD material of layer 7 should be etchable selectively with respect to the third ILD material, i.e. a layer of the third ILD material can serve as a mask for anisotropically etching the second ILD material. When the first and second ILD materials are SiCO and SiN, the third ILD material could be SiCN. The steps are the same up to and including the step resulting in the situation shown in FIG. 1D. Now however, the third ILD material 25 is deposited in the trench 5, and planarized to the level of the upper layer 4 of the first ILD material (possibly slightly thinning layer 4), as illustrated in FIG. 2A. Then a second hardmask 26 (the first being the one used for etching the trench 5) is thrilled which defines the width of the eventual upper conductive line, see FIG. 2B. The mask 26 covers the whole surface except for an opening 27 having the width of the upper line. The opening 27 extends to one side of the trench 5, while also overlapping the trench itself and a portion of the first ILD material of layer 4 on the opposite side of the trench 5.

As shown in FIG. 2C, the third ILD material 25 is then removed by anisotropic etching, within the mask opening 27, relative to the ILD material of the top layer 4 and stopping on the second ILD material 7 in the trench (by a timed etch or because the etch of the third ILD material 25 is selective with respect to the second ILD material 7), creating a partial via opening 28 that is self-aligned to the side of the trench 5 and to the width of the mask opening 27.

Then a third mask 29 is formed in addition to the second mask 26, see FIG. 2D. The third mask 29 covers one side of the trench 5 along a longitudinal portion thereof as well as the first ILD material of the top layer 4 to the one side of the trench 5. With the two masks 26 and 29 in place, the first ILD material of the top layer 4 is removed within the opening 30 defined by the two masks, by etching the first ILD material of the top layer 4 relative to the second ILD material 7, and stopping on the etch stop layer 3. Both masks 26 and 29 are then stripped, resulting in the situation shown in FIG. 2E; along line A-A, the first ILD material of the top layer 4 is removed at one side of the trench, and a remaining portion 11 of the top layer 4 is maintained at the opposite side of the trench, the remaining portion being self-aligned to the opposite side of the trench. Opposite the remaining portion 11, a second trench 31 is formed, extending in the X-direction and overlapping the first trench 5, and with the end face of the second trench 31 self-aligned to the side of the first trench 5.

The second ILD material 7 is then removed by etching relative to the remaining portion 11 of the first ILD material, the etch layer 3 and the third ILD material 25, and stopping on the metal of the lower line 6 (either by a timed etch or through etch selectivity with respect to the metal of line 6), see FIG. 2F. This creates a via opening 14 that is self-aligned to the width of the lower line 6 and to the end face and the width of the second trench 31. The mask for producing the via opening 14 thus consists of the remaining first ILD portion 11, the etch stop layer 3 and the third ILD material 15.

Finally, a metal layer is deposited, filling the via opening 14 and the second trench 31. The metal is planarized, thereby creating the metal interconnect via 16 and the upper line 21, see FIG. 2G, this time with the via 16 being aligned not only to the line end of the upper line 21 but also to the line width of the upper line 21.

FIGS. 3A to 3J illustrate how the first embodiment can be applied for producing a construct with two sets of parallel lines in levels M, and $M_{x+1}$, having the same line width and pitch, the sets being mutually perpendicular, and wherein two collinear lines of level $M_{x+1}$ are spaced apart from each other. The disclosure can facilitate this construct in such a way that the line ends of the two spaced-apart lines in level $M_{x+1}$ are respectively connected to two adjacent lines in level $M_x$ through a pair of interconnect vias which are self-aligned to the line width of the lower lines and to the line ends of the collinear upper lines.

As seen in FIG. 3A, a set of parallel trenches 5 is now produced through layers 1, 3, and 4, and filled with metal, which is subsequently etched back, creating thereby the parallel lines 6 of level $M_x$. Alternatively, the lines 6 could be formed by area selective deposition. The trenches are filled with the second ILD material 7 which is then etched back, see FIG. 3B tor alternatively by area selective deposition). Then the second hardmask 10 is formed (the first hardmask being the one used for etching the trenches 5), as shown in FIG. 3C. in the X-direction, the hardmask 10 now covers one portion of the first ILD material of the top layer 4 between two adjacent trenches 5a and 5b.

Following this, the first ILD material of the top layer 4 is removed by etching this material selectively relative to the second ILD material 7, and stopping on the etch stop layer 3, and the second mask 10 is stripped, see FIG. 3D. A pillar 11 of the first ILD material remains.

The third hardmask 12 is formed, see FIG. 3E. In this case, the opening 13 in the mask 12 is placed above and transversely to the pillar 11, revealing two equal portions 7a and 7b of the second ILD material on either side of the pillar as well as (for example) equal portions 3a and 3b of the etch stop layer 3 on either side of the equal portions 7a, 7b of the second ILD material.

With the mask 12 in place, the portions 7a and 7b of the second ILD material are anisotropically etched, stopping on two adjacent metal lines 6a and 6b, after which the mask 12 is stripped, see FIG. 3F, so that two via openings 14a and 14b are created, which are self-aligned to the side of the pillar 11 in the Y-direction.

The metal layer 15 is then produced and planarized, see FIG. 3G, creating two via connections 16a and 16b, which are self-aligned to the width of the two adjacent lower lines 6a and 6b.

Then the fourth mask 20 is formed, see FIG. 3H. The fourth mask is now designed to create parallel lines in the X-direction, i.e. perpendicular to the lower lines 6. One of the lines of the mask 20 overlaps the pillar 11.

With the fourth mask 20 in place, the metal 15 is anisotropically etched and the mask 20 is then stripped, leading to the situation shown in FIG. 3I. Two mutually perpendicular sets of parallel lines 6 and 21 are created in levels and respectively. Two colinear lines 21a and 21b in the upper level are connected to two adjacent lines 6a and 6b in the lower level through the via connections 16a and 16b. In the last step, illustrated in FIG. 3J, a layer 22 of (for example) the first ILD material is deposited and planarized completing the levels $M_x$ and $M_{x+1}$.

The same construct having two collinear lines and two self-aligned via connections can also be realized by applying the second embodiment, as illustrated in FIGS. 4A to 4H. After the step pictured in FIG. 3B, the trenches 5 are now filled with the third ILD material 25, and the wafer is then planarized, as shown in FIG. 4A.

Then the second mask 26 is formed, which now defines multiple parallel lines in the X-direction. With this mask in place, the third ILD material 25 is etched anisotropically relative to the first ILD material of the top layer 4, and stopping on the second ILD material 7, leading to the image shown in FIG. 4B.

Then the third mask 29 is added, as shown in FIG. 4C, covering a portion of the central wall of the first ILD material of the top layer 4, and bridging the gap between two parallel lines of the mask 26. With the two masks 26 and 29 in place, the first ILD material of the top layer 4 is then removed selectively with respect to the second ILD material 7, and stopping on the etch stop layer 3. After the masks 26 and 29 are stripped, the image in FIG. 4D is obtained. Along the line A-A, the first ILD material is removed except in a central remaining portion 11 that is self-aligned to the space between two adjacent lower metal lines 6a and 6b. Outside the central remaining portion 11 parallel trenches 39 are firmed extending in the direction perpendicular to the lower metal lines 6.

A fourth mask 40 is now applied (not needed in the sequence shown in FIGS. 2A-2G), as shown in FIG. 4E, covering the whole surface except for a central opening that reveals two portions 7a and 7b of the second ILD material 7 immediately adjacent to the remaining central portion 11 of the first material. The opening furthermore partially reveals portions of the first and second ILD materials and of the etch stop layer 3 surrounding the two portions 7a and 7b of the second ILD material. These latter portions 7a and 7b are then removed by anisotropic etching selectively with respect to the first ILD material, the third ILD material and the etch stop layer, see FIG. 4F, creating two via openings 14a and 14b, which are self-aligned in the X-direction to the width of the underlying metal lines 6a and 6b and in the Y-direction to the width of the trenches 39.

The mask 40 is then stripped (FIG. 4G), and then the via openings 14a and 14b and the trenches 39 in the upper level are filled with metal (FIG. 4H), leading to the desired construct, comprising the via connections 16a and 16b and the collinear metal lines 21a and 21b. The via connections are now self-aligned to the lower lines 6a and 6b and the upper lines 21a and 21b in both the X and Y directions.

In the above-described embodiments, the top layer 4 is formed of the same ILD material as the bottom layer 1. The top layer 4 could however be formed from an ILD material different from the first ILD layer 1, with the understanding that the ILD material of the top layer 4 should behave in the same manner as the first ILD material in terms of etch selectivity relative to the second and third ILD materials 7 and 2.5, and relative to the etch stop layer 3.

Furthermore, the first, second, and third ILD materials are not limited to single materials, but each of the layers 2, 4, 7, and 25 could for example consist of a stack of different ILD materials, which all have the above-described characteristics of selectivity. Etching either one of these layer could then require different etch recipes for etching through the different materials.

ILD materials for layers 4, 7, and 25 can be all selectively etchable with respect to each other, i.e. each material may serve as a mask for anisotropically etching the other.

The disclosure is also related to a semiconductor component, such as an integrated circuit obtainable by the method of the disclosure. Such a component comprises a semiconductor base substrate (2) and on this base substrate a front end of line portion and a back and of line portion, the back end of line portion comprising multiple levels (M0, M1, etc.) of interconnected electrical conductors, the levels being interconnected by interconnect vias, and wherein the BEOL portion comprises an interconnect via (16) that is connected to two electrically conductive lines (6, 21) running in mutually transverse directions, the via (16) being self-aligned at its lower end to the width of a lover electrically conductive line (6) in a level $M_x$ of the BEOL portion and at its upper end to at least the line end of an upper electrically conductive line (21) of a level of the BEOL portion, the electrically conductive lines (6, 21) and the interconnect via (16) being embedded in at least two different ILD materials.

characterized in that:

at least the line end of the upper line (21) is in direct contact with a portion (11) of ILD material. In the first embodiment, this is the pillar 11 illustrated in FIG. 1K. In the second embodiment, this is the portion 11 shown in FIG. 2G, in the direction of the lower line (6), the interconnect via 16) is isolated on both sides by a second ILD material (7), that is etchable selectively with respect to the ILD material of the portion (11) in direct contact with the line end of the upper line (21) and vice versa. In both the first and the second embodiment, the second ILD material is the material 7 present on either side of the interconnect via 16 in the Y direction (see for example FIG. 1K), an etch stop layer (3) is present underneath the upper line (21), wherein the etch stopping function of the etch stop layer (3) is relative to an etch recipe for etching the ILD material of the portion (11) in direct contact with the line end of the upper line (2I).

The disclosure is also related to the intermediary product obtained in the course of performing the method, and defined as a semiconductor substrate comprising at least one level of a multilevel interconnect structure, the at least one level comprising a line-shaped conductor (6) oriented in a given direction and embedded in a layer (1) of a first ILD material, the layer having a thickness higher than the conductor (6), wherein the conductor is located at the bottom of a trench (5) through the layer of the first ILD material (1), the substrate further comprising:

an etch stop layer (3) on the first layer (1) of the first ILD material, and a portion (11) of an ILD material extending above the etch stop layer (3) and being aligned to one side of the trench (5), wherein the etch stopping function of the etch stop layer (3) is relative to an etch recipe for etching the ILD material of the portion (11) extending above the etch stop layer (3), an elongate portion 7) of a second ILD material that is selectively etchable with respect to the material of the portion (11) extending above the etch stop layer and vice versa, the second material also being selectively etchable with respect to the etch stop layer (3), the elongate portion (7) being present on top of the conductor (6) the elongate portion (7) of the second ILD material being interrupted by a via (14) adjacent to the ILD portion (11) extending above the etch stop layer (3).

The intermediate product is illustrated for the first embodiment in FIGS. 1H and 3F and for the second embodiment in FIGS. 2F and 4G.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
   producing on a substrate a stack of:
      a first layer comprising a first dielectric material,
      a second layer comprising dielectric material on the first layer, and
      an etch stop layer between the first layer and the second layer,
   etching a trench through the second layer, then through the etch stop layer, and then through the first layer,
   producing a lower conductive line in the trench,
   producing a third layer comprising a second dielectric material in the trench and on the lower conductive line,
   removing a first portion of the second layer, such that a second portion of the second layer remains in contact with the etch stop layer,
   etching a via opening through the third layer in the trench, using the second portion of the second layer as a mask, and
   depositing a conductive upper line and an interconnect via on the lower conductive line within the via opening.

2. The method according to claim 1, wherein producing the lower conductive line comprises filling the trench with a conductive material and etching the conductive material.

3. The method according to claim 1, wherein producing the third layer comprises filling the trench with the third layer and etching the third layer in the trench selectively with respect to the second layer.

4. The method according to claim 1, wherein removing the first portion of the second layer comprises applying a first mask to remove the first portion of the second layer, thereby creating the second portion of the second layer in a form of a pillar that is self-aligned to the trench.

5. The method according to claim 4, wherein etching the via opening comprises applying a second mask and etching a portion of the third layer that is uncovered by the second mask.

6. The method according to claim 1, further comprising:
   depositing a fourth layer comprising a third dielectric material in the trench on the third layer, wherein the fourth layer is etchable selectively with respect to the second layer, wherein the third layer is etchable selectively with respect to the fourth layer,
   removing the fourth layer from the trench in an area corresponding to a width of the conductive upper line, so that remaining portions of the fourth layer on either side of the width serve as portions of a mask, and
   etching the via opening via the mask, so that the via opening is self-aligned to the width of the conductive upper line.

7. The method according to claim 1, the method comprising:

depositing a fourth layer comprising a third dielectric material in the trench on the third layer thereby filling the trench, wherein the fourth layer is etchable selectively with respect to the second layer, wherein the third layer is etchable selectively with respect to the fourth layer, planarizing the fourth layer until an upper surface of the second layer is exposed, applying a first mask that defines a position and width of the conductive upper line, removing the fourth layer from the trench in an area defined by the first mask and by the second layer, with the first mask in place, applying a second mask which covers the second portion of the second layer while leaving the first portion of the second layer exposed, with the first mask and the second mask in place, etching the first portion of the second layer to the etch stop layer, and stripping the first mask and the second mask, thereby obtaining the second portion of the second layer that is self-aligned to the trench while creating a transverse trench in the second layer on the opposite side of the trench, the transverse trench defining the position of the conductive upper line, etching the via opening using the second layer, the etch stop layer, and the fourth layer as a mask, and filling the transverse trench with an electrically conductive material, thereby obtaining the interconnect via and the conductive upper line.

8. The method according to claim 1, wherein the interconnect via is a first interconnect via, the method further comprising producing a second interconnect via such that the first interconnect via and the second interconnect via connect parallel lower conductive lines to collinear upper lines, wherein the first interconnect via and the second interconnect via are self-aligned to the lower conductive lines and to ends of the collinear upper lines.

9. The method according to claim 1, wherein the second layer comprises the first dielectric material.

10. The method of claim 1, wherein the conductive upper line is transverse to the lower conductive line.

11. The method of claim 1, wherein the interconnect via is self-aligned with the lower conductive line.

12. The method of claim 1, wherein the etch stop layer is etch resistant to a process that etches the second layer.

13. The method of claim 1, wherein etching the trench comprises etching the trench through an entire thickness of the first layer.

14. The method of claim 1, wherein the first layer is selectively etchable with respect to the second layer.

15. The method of claim 1, wherein the second layer is selectively etchable with respect to the first layer.

16. The method of claim 1, wherein removing the first portion of the second layer comprises etching the second layer until reaching the etch stop layer.

17. The method of claim 1, wherein the second portion of the second layer is aligned with the trench.

18. The method of claim 1, wherein producing on the substrate the stack comprises producing the etch stop layer such that the etch stop layer contacts the first layer and the second layer.

19. The method of claim 1, wherein producing the lower conductive line in the trench comprises producing the lower conductive line such that the lower conductive line contacts the substrate and an upper end of the lower conductive line is within the first layer and below the etch stop layer.

20. The method of claim 1, wherein producing the third layer comprises producing the third layer such that the third layer contacts the lower conductive line and extends through the etch stop layer.

* * * * *